(12) United States Patent
Wang et al.

(10) Patent No.: US 11,016,625 B2
(45) Date of Patent: May 25, 2021

(54) DISPLAY PANEL AND DEFORMATION SENSING METHOD THEREOF, AND DISPLAY DEVICE

(71) Applicant: BOE TECHNOLOGY GROUP CO., LTD., Beijing (CN)

(72) Inventors: Jinqian Wang, Beijing (CN); Tieshi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/761,976

(22) PCT Filed: Oct. 16, 2019

(86) PCT No.: PCT/CN2019/111486
§ 371 (c)(1),
(2) Date: May 6, 2020

(87) PCT Pub. No.: WO2020/078389
PCT Pub. Date: Apr. 23, 2020

(65) Prior Publication Data
US 2020/0264734 A1 Aug. 20, 2020

(30) Foreign Application Priority Data
Oct. 16, 2018 (CN) .......................... 201811204678.6

(51) Int. Cl.
*G06F 3/044* (2006.01)
*G06F 3/041* (2006.01)
(Continued)

(52) U.S. Cl.
CPC .......... *G06F 3/0447* (2019.05); *G06F 3/0412* (2013.01); *G06F 3/0445* (2019.05);
(Continued)

(58) Field of Classification Search
CPC . G06F 3/0445; G06F 3/0412; H01L 27/3225; H01L 2251/5338; H01L 27/3244;
(Continued)

(56) References Cited

U.S. PATENT DOCUMENTS 9,559,169 B2 *   1/2017   Yoon ................. H01L 29/78696
10,216,025 B2    2/2019   Wang et al.
(Continued)

FOREIGN PATENT DOCUMENTS

CN          105136378 A      12/2015
CN          105824475 A       8/2016
(Continued)

OTHER PUBLICATIONS

International Search Report of PCT/CN2019/111486 in Chinese, dated Jan. 19, 2020, with English translation.
(Continued)

*Primary Examiner* — Vinh T Lam
(74) *Attorney, Agent, or Firm* — Collard & Roe, P.C.

(57) ABSTRACT

A display panel and deformation sensing method thereof, and a display device are provided. The display panel includes a substrate, and a deformation sensing unit on the substrate; the deformation sensing unit includes a first electrode, a second electrode, and a third electrode, the second electrode and the third electrode being configured to form a first capacitor, the first electrode and the second electrode being configured to form a second capacitor, the first electrode and the third electrode being configured to form a third capacitor, and the first capacitor, the second capacitor, and the third capacitor being configured to determine a shape-state of the display panel.

17 Claims, 9 Drawing Sheets

(51) Int. Cl.
  *H01L 27/32* (2006.01)
  *H01L 51/00* (2006.01)

(52) U.S. Cl.
  CPC ...... *H01L 27/3225* (2013.01); *H01L 27/3244* (2013.01); *H01L 51/0097* (2013.01); *H01L 2251/5338* (2013.01)

(58) Field of Classification Search
  CPC ............. H01L 51/0031; H01L 51/0097; H01L 27/3265
  See application file for complete search history.

(56) References Cited

U.S. PATENT DOCUMENTS

| | | | |
|---|---|---|---|
| 10,234,351 B2 | 3/2019 | Yang et al. | |
| 10,454,047 B2 | 10/2019 | Kim | |
| 10,585,535 B2 | 3/2020 | Liu et al. | |
| 2014/0225848 A1* | 8/2014 | Ogura | G06F 3/041 345/173 |
| 2015/0277626 A1* | 10/2015 | Shinkai | G06F 3/0446 345/174 |
| 2015/0363019 A1* | 12/2015 | Schediwy | G06F 3/0445 345/174 |
| 2016/0202814 A1* | 7/2016 | Lee | G06F 3/0412 345/173 |
| 2016/0247870 A1* | 8/2016 | Park | H01L 51/5218 |
| 2017/0160866 A1* | 6/2017 | Tsai | G06F 3/0412 |
| 2017/0192590 A1 | 7/2017 | Lim et al. | |
| 2019/0035870 A1* | 1/2019 | Park | H01L 27/3265 |
| 2019/0064958 A1* | 2/2019 | Liu | G06F 3/0446 |
| 2019/0278407 A1* | 9/2019 | Ma | G06F 3/04166 |
| 2019/0280066 A1* | 9/2019 | Lin | H01L 27/3225 |
| 2019/0393278 A1* | 12/2019 | Wu | H01L 27/3225 |
| 2020/0264734 A1 | 8/2020 | Wang et al. | |

FOREIGN PATENT DOCUMENTS

| | | |
|---|---|---|
| CN | 106206666 A | 12/2016 |
| CN | 106445267 A | 2/2017 |
| CN | 107305906 A | 10/2017 |
| CN | 107562246 A | 1/2018 |
| CN | 108268159 A | 7/2018 |
| CN | 108511494 A | 9/2018 |
| CN | 109192071 A | 1/2019 |

OTHER PUBLICATIONS

Chinese Office Action in Chinese Application No. 201811204678.6, dated Jul. 15, 2020 with English translation.

* cited by examiner

DISPLAY PANEL AND DEFORMATION SENSING METHOD THEREOF, AND DISPLAY DEVICE

CROSS REFERENCE TO RELATED APPLICATIONS

This application is the National Stage of PCT/CN2019/111486 filed on Oct. 16, 2019, which claims priority under 35 U.S.C. 0.5119 of Chinese Application No. 201811204678.6 filed on Oct. 16, 2018, the disclosure of which is incorporated by reference.

TECHNICAL FIELD

Embodiments of the present disclosure relate to a display panel and a deformation sensing method thereof, and a display device.

BACKGROUND

With the rapid development of display technology, more and more human-computer interaction technologies are used in display panels. For example, touch display panels have become the most convenient electronic devices of human-computer interaction, which have combined nature of a touch function and a display function, and can be widely applied to portable electronic devices. To further enrich the diversity of human-computer interaction, some display panels have combined interaction approaches, such as a voice control approach and a force control approach, to further improve the user's experience of the human-computer interaction.

With the emergence of flexible screens, the way that users interact with devices is more diverse, because after the display panel is "softened", the performance of the display panel is more extensive. At present, a deformation scheme that screen bending is used to realize command input has been proposed, which allows users to control applications by bending the screen, such as virtual turning book page or games and other functions. The deformation scheme uses an external bending sensor arranged on the display panel to monitor the force applied to the screen, and simulate physical strength through different vibration levels.

SUMMARY

At least one embodiment of the present disclosure provides a display panel. The display panel comprises a substrate, and a deformation sensing unit on the substrate. The deformation sensing unit comprises a first electrode, a second electrode, and a third electrode, the second electrode and the third electrode being configured to form a first capacitor, the first electrode and the second electrode being configured to form a second capacitor, the first electrode and the third electrode being configured to form a third capacitor, and the first capacitor, the second capacitor, and the third capacitor being configured to determine a shape-state of the display panel.

For example, the display panel further comprises a display unit. The display unit comprises a thin film transistor, the first electrode is arranged on a same layer as both a source electrode and a drain electrode of the thin film transistor, and both the second electrode and the third electrode are arranged on a dielectric layer covering the first electrode.

For example, the dielectric layer is provided with an electrode via hole at a position of the first electrode, and the second electrode and the third electrode are arranged on the dielectric layer and arranged on two sides of the electrode via hole, respectively.

For example, the first electrode, the second electrode, and the third electrode are respectively connected with a processing module, the processing module inputs scanning signals to the first electrode, the second electrode, and the third electrode, respectively, and detects a capacitance value of at least one of the capacitors to obtain a change relationship of the capacitance value, and determine the shape-state of the display panel according to the change relationship of the capacitance value.

For example, the deformation sensing unit further comprises a first lead wire, a second lead wire, and a third lead wire; the first electrode is connected with the processing module through the first lead wire, the second electrode is connected with the processing module through the second lead wire, and the third electrode is connected with the processing module through the third lead wire, respectively; the first lead wire is arranged on a same layer as a gate electrode of the display unit, the first electrode is connected with the first lead wire through a first connection via hole; the second lead wire and the second electrode are arranged on a same layer, and the second lead wire is directly connected with the second electrode; the third lead wire is arranged on a same layer as the source electrode and the drain electrode of the display unit, and the third electrode is connected with the third lead wire through a second lead via hole.

For example, the deformation sensing unit comprises: a first insulating layer covering the substrate; a first lead wire arranged on the first insulating layer, the first lead wire being arranged on a same layer as a gate electrode of the display unit; a second insulating layer covering the first lead wire, a first lead via hole exposing the first lead wire being arranged in the second insulating layer; the first electrode and a third lead wire that are arranged on the second insulating layer, the first electrode being connected with the first lead wire through the first lead via hole, and both the first electrode and the third lead wire being arranged on a same layer as a source electrode and a drain electrode of the display unit; a planarization layer and a dielectric layer covering both the first electrode and the third lead wire, the planarization layer being provided with an electrode via hole and a second lead via hole at positions of the first electrode and the third lead wire, respectively, and the dielectric layer is provided with the electrode via hole and the second lead via hole at the positions of the first electrode and the third lead wire, respectively; the second electrode and the third electrode arranged on the dielectric layer, the second electrode and the third electrode being provided on two sides of the electrode via hole, respectively, and the third electrode being connected with the third lead wire through the second lead via hole; and a pixel definition layer covering both the second electrode and the third electrode.

For example, the display unit comprises: an active layer arranged on the substrate; a first insulating layer covering the active layer; a gate electrode arranged on the first insulating layer, the gate electrode and a first lead wire of the deformation sensing unit being arranged on a same layer; a second insulating layer covering the gate electrode, first connection via holes exposing the active layer being formed in the second insulating layer; a source electrode and a drain electrode arranged on the second insulating layer, the source electrode and the drain electrode being respectively connected with the active layer through the first connection via holes, and the source electrode and the drain electrode being arranged on a same layer as both the first electrode and a third lead wire of the deformation sensing unit; a planarization layer covering the source electrode and the drain electrode, a second connection via hole exposing the drain electrode being formed in the planarization layer; an anode arranged on the planarization layer, the anode being connected with the drain electrode through the second connection via hole; and a dielectric layer and a pixel definition layer covering the anode, a pixel definition opening exposing the anode being formed in the pixel definition layer.

For example, the substrate is a flexible substrate.

At least one embodiment of the present disclosure also provides a display device, comprising the display panel.

At least one embodiment of the present disclosure also provides a deformation sensing method of a display panel. The display panel comprises a substrate, a deformation sensing unit is arranged on the substrate, the deformation sensing unit comprising a first electrode, a second electrode and a third electrode, the second electrode and the third electrode being configured to form a first capacitor, the first electrode and the second electrode being configured to form a second capacitor, the first electrode and the third electrode being configured to form a third capacitor; and the deformation sensing method comprises: obtaining a change relationship of capacitance values in the deformation sensing unit; and determining a shape-state of the display panel according to the change relationship of the capacitance values.

For example, the obtaining the change relationship of the capacitance values in the deformation sensing unit comprises: inputting scanning signals to the first electrode, the second electrode, and the third electrode respectively, detecting the capacitance value of the first capacitor and the capacitance value of the second capacitor, respectively; comparing the capacitance value of each capacitor with a reference capacitance value of the respective capacitor, when a difference between each capacitance value and a corresponding reference capacitance value is greater than or equal to a preset change threshold, determining a change nature of the capacitance value of each capacitor; and obtaining the change relationship of the capacitance value according to the change nature of the capacitance value of each capacitor.

For example, the reference capacitance value is a capacitance value of each capacitor detected when the display panel is not subjected to any external force; the preset change threshold comprises a change threshold $\Delta 1$ of the first capacitor and a change threshold $\Delta 2$ of the second capacitor, $\Delta 1=(0.02\sim0.1)\ Q_{C1}$, $\Delta 2=(0.02\sim0.1)\ Q_{C2}$, where $Q_{C1}$ is the reference capacitance value of the first capacitor, and $Q_{C2}$ is the reference capacitance value of the second capacitor.

For example, the comparing the capacitance value of each capacitor with the reference capacitance value of the respective capacitor, when the difference between the capacitance value and the corresponding reference capacitance value is greater than or equal to the preset change threshold, determining the change nature of the capacitance value of each capacitor, comprises: comparing $|Q_{C1}'-Q_{C1}|$ with $\Delta 1$ and comparing $|Q_{C2}'-Q_{C2}|$ with $\Delta 2$, respectively, where $Q_{C1}'$ is a detection capacitance value of the first capacitor, and $Q_{C2}'$ is a detection capacitance value of the second capacitor; if $|Q_{C1}'-Q_{C1}|\geq\Delta 1$ or $|Q_{C2}'-Q_{C2}|\geq\Delta 2$, comparing $Q_{C1}'$ and $Q_{C1}$, or comparing $Q_{C2}'$ and $Q_{C2}$; and based on a comparison result to determine the change nature of each capacitor, the change nature comprising: increase in capacitance value or decrease in capacitance value.

BRIEF DESCRIPTION OF THE DRAWINGS

The embodiments of the present disclosure will be described in more detail below with reference to the accompanying drawings, so that those skilled in the art can more clearly understand the embodiments of the present disclosure, in which.

DETAILED DESCRIPTION

Figure 1A:
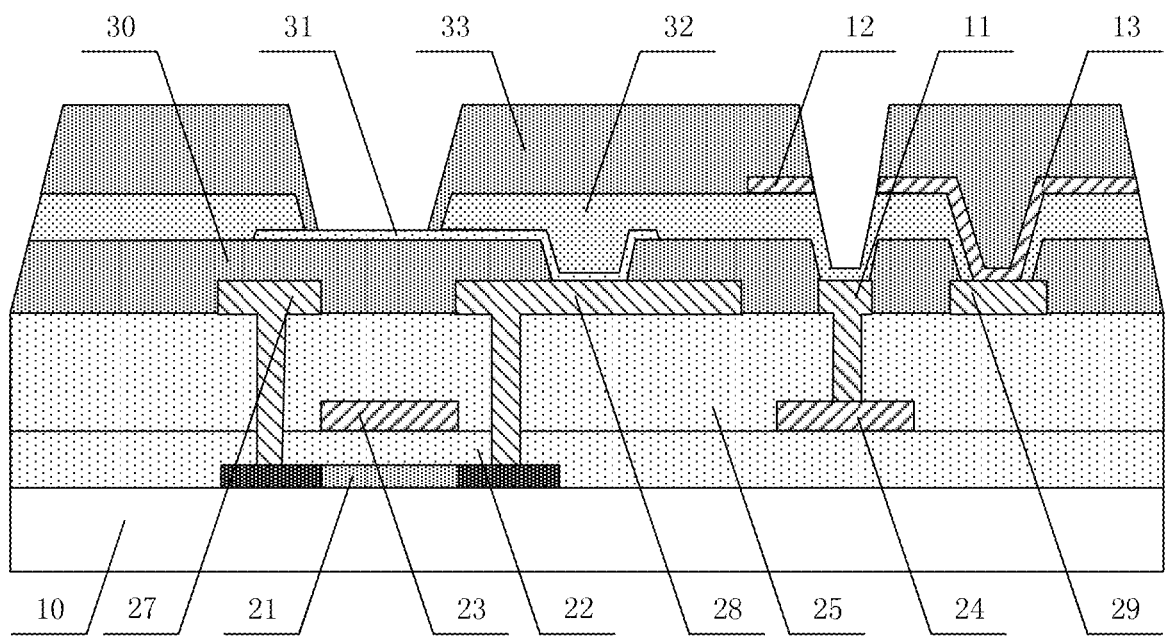
FIG. 1A is a schematically structural cross-section view of a display panel according to an embodiment of the present disclosure.

Technical schemes of the embodiments will be described in a clearly and fully understandable way in connection with the drawings related to the embodiments of the disclosure. It is apparent that the described embodiments are a part but not all of the embodiments of the disclosure. Based on the described embodiments herein, one of ordinary skill in the art can obtain other embodiment(s), without any creative work, which shall be within the scope of the disclosure. It is to be noted that, throughout the description, same or similar reference numerals indicate the same or similar elements or elements with the same or similar functions. The embodiments described below with reference to the drawings are exemplary, and are only used to explain the present disclosure, and thus cannot be explained as a limit of the present disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. The terms, such as 'comprise/comprising,' 'include/including,' or the like, are intended to specify that the elements or the objects stated before these terms encompass the elements or the objects and equivalents thereof listed after these terms, but not preclude other elements or objects. The phrases "connect/connection", "connected/connecting", etc., are not intended to be limited to a physical connection or a mechanical connection, but may include an electrical connection which is direct or indirect.

The inventors of the present application found that in a case that the deformation scheme in the art is applied to a display panel, the deformation scheme in the art makes a great impact on the reliability and the cost of the display panel. On one hand, a sensor with an external structure is easily damaged during use, and the product reliability of the display panel is low; in addition, adding an external sensor requires adding new production equipment and processes, and the product cost of the display panel is high.

To solve the problems of low reliability and high cost of the deformation scheme, at least one embodiment of the present disclosure provides a display panel integrated with a deformation sensing unit, and the display panel can realize image display, and can also realize deformation sensing. The display panel in the embodiment of the present disclosure may be an organic light emitting diode (OLED) display panel, an electronic paper (E-Paper), or other flexible display panels. The technical scheme of the embodiment of the present disclosure is described below by using the deformation sensing unit being integrated in the OLED display panel only as an example.

A main structure of the display panel in the embodiment of the present disclosure includes a display unit for realizing image display and a deformation sensing unit for realizing deformation sensing which are formed on a substrate by a same manufacturing process, the deformation sensing unit includes capacitors formed by more than two electrodes for determining a shape-state of the display panel, so that the display panel in the embodiment of the present disclosure simultaneously realizes a function of image display and a function of deformation sensing. For example, the deformation sensing unit is used for changing a capacitance value of the display panel in a case that the deformation sensing unit is subjected to an external force, and the shape-state of the display panel is reflected by a change relationship of the capacitance values.

Generally, a plurality of pixel units arranged in a matrix are formed on the substrate, the display unit and the deformation sensing unit in the embodiment of the present disclosure may adopt various layout methods. For example, both the display unit and the deformation sensing unit are arranged in each of the pixel units. For another example, the display units are arranged in a part of the pixel units, and the deformation sensing units are arranged in another part of the pixel units. As another example, both the display units and the deformation sensing units are arranged in a part of the pixel units, only the display units are arranged in another portion of the pixel units, and so on.

FIG. 1A is a schematically structural view of a display panel provided by an embodiment of the present disclosure. As shown in FIG. 1A, the display unit may include a gate electrode 23, an active layer 21, a source electrode 27, a drain electrode 28, an anode 31, a light-emitting layer (not shown in FIG. 1A), and a cathode (not shown in FIG. 1A), and the deformation sensing unit includes a first electrode 11, a second electrode 12, and a third electrode 13 for forming three capacitors. The first electrode 11 is arranged on a same layer as the source electrode 27 and the drain electrode 28, and the first electrode 11, the source electrode 27, and the drain electrode 28 are formed by one patterning process; the second electrode 12 and the third electrode 13 are arranged on a dielectric layer 32 covering the first electrode 11, the second electrode 12 and the third electrode 13 are arranged on a same layer and are formed by one patterning process, and the second electrode 12 and the third electrode 13 are arranged on two sides of the first electrode 11, respectively, and the first electrode 11, the second electrode 12, and the third electrode 13 form a substantially triangular layout. For example, further, in order to increase a movement amount of the second electrode 12 and a movement amount of the third electrode 13 under an action of external force, the dielectric layer 32 is provided with an electrode via hole at a position of the first electrode 11, and the second electrode 12 and the third electrode 13 are arranged on the dielectric layer 32 and arranged on two sides of the electrode via hole, respectively.

Figure 1B:
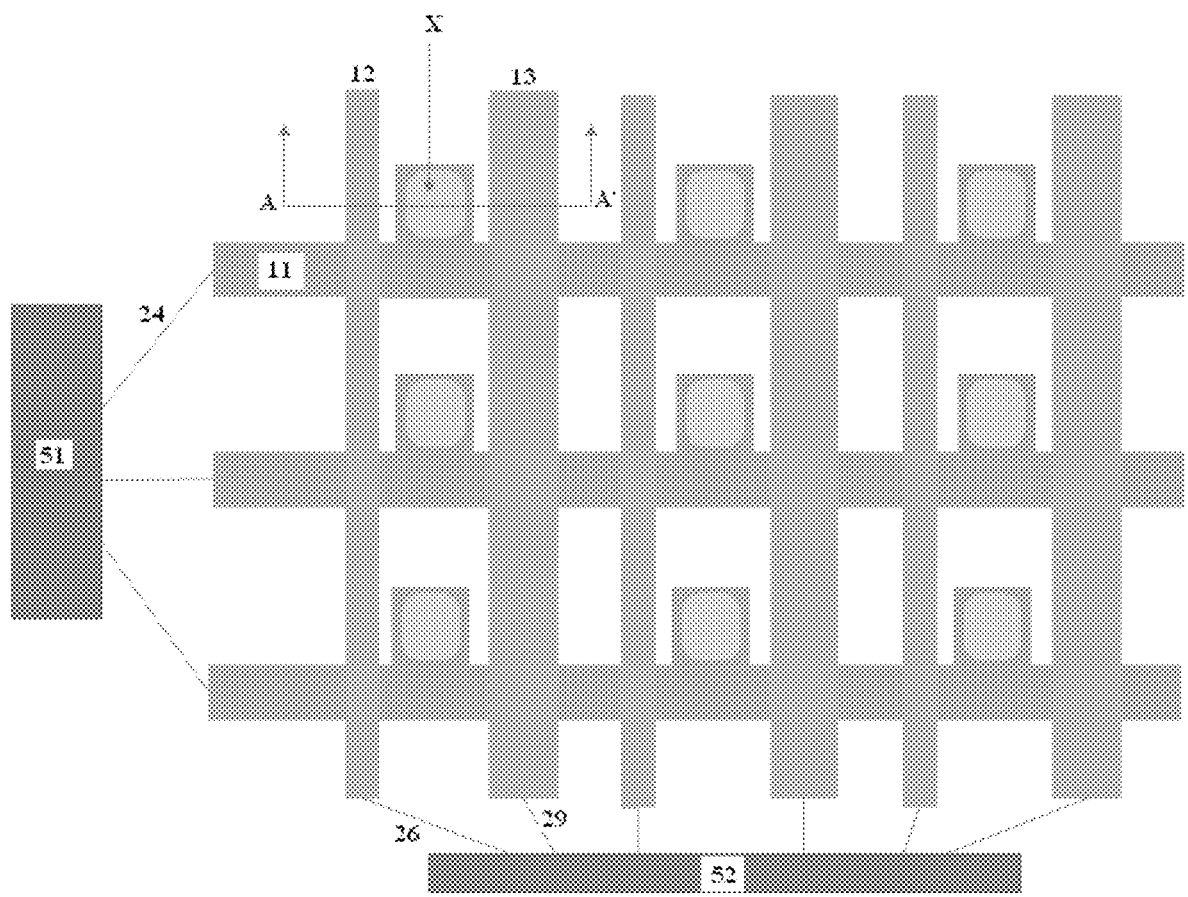
FIG. 1B is a schematically structural plan diagram of a display panel according to an embodiment of the present disclosure.

In the embodiment of the present disclosure, a first capacitor is formed between the second electrode 12 and the third electrode 13, a second capacitor is formed between the first electrode 11 and the second electrode 12, and a third capacitor is formed between the first electrode 11 and the third electrode 13. The first electrode 11, the second electrode 12, and the third electrode 13 are respectively connected with a processing module in a peripheral circuit, the processing module inputs scanning signals to the first electrode 11, the second electrode 12, and the third electrode 13, respectively, and detects capacitance values of the first capacitor, the second capacitor, and the third capacitor, to obtain a change relationship of the capacitance values of the first capacitor and the second capacitor, or to obtain a change relationship of the capacitance values of the first capacitor, the second capacitor, and the third capacitor, and determine the shape-state (configuration) of the display panel according to the change relationship of the capacitance values. In order to realize the connections between the processing module and the first electrode 11, between the processing module and the second electrode 12, and between the processing module and the third electrode 13, the display panel in the embodiment of the present disclosure further includes a first lead wire 24, a second lead wire (not shown), and a third lead wire 29. The processing module is connected with the first electrode 11 through the first lead wire 24, connected with the second electrode 12 through the second lead wire, and connected with the third electrode 13 through the third lead wire 29. As shown in FIG. 1A and FIG. 1B, the first lead wire 24 is arranged on a same layer as the gate electrode 23 of the display unit, and the first lead wire 24 and the gate electrode 23 are formed by one patterning process, the second lead wire 26 is arranged on a same layer as both the second electrode 12 and the third electrode 13, and the second lead wire 26, the second electrode 12, and the third electrode 13 are formed by one patterning process, the third lead wire 29 is arranged on a same layer as the source electrode 27 and the drain electrode 28 of the display unit, and the third lead wire 29, the source electrode 27, and the drain electrode 28 are formed by one patterning process. The first electrode 11 is connected with the first lead wire 24 through a first lead via hole, the second electrode 12 is directly connected with the second lead wire, and the third electrode 13 is connected with the third lead wire 29 through a second lead via hole.

For example, as shown in FIG. 1B, the processing module includes a first processor 51 and a second processor 52, the first electrode 11 is electrically connected with the first processor 51 through the first lead wire 24, the second electrode 12 and the third electrode 13 are electrically connected with the second processor 52 through the second lead wire 26 and the third lead wire 29, respectively. Furthermore, for example, the first processor 51 and the second processor 52 may be integrated into one processor, and all the first lead wire 24, the second lead wire 26, and the third lead wire 29 are connected with a same processor.

The technical scheme of the embodiment is further described below by the manufacturing process of the display panel. The "patterning process" mentioned in the embodiments of the present disclosure may include processes, such as depositing a film layer, coating a photoresist, exposing by a mask, developing, etching, and stripping the photoresist. Depositing can use known processes, such as sputtering, evaporation, and chemical vapor deposition, and so on, coating can use known coating processes, etching can use known processes.

The/a "same manufacturing process" mentioned in the embodiment of the present disclosure includes the following patterning processes for forming various patterns.

Figure 2:
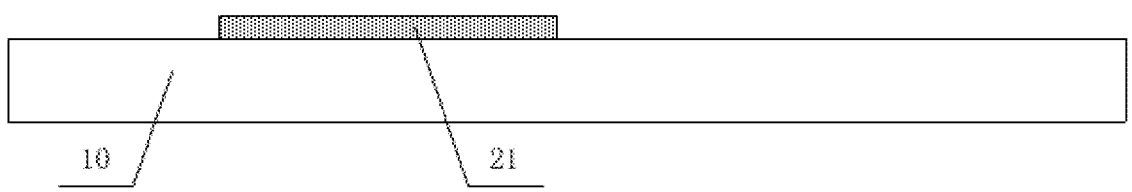
FIG. 2 is a schematic cross-section view of the display panel after a pattern of an active layer is formed according to an embodiment of the present disclosure.

First, a pattern of an active layer is formed on the substrate. Forming the pattern of the active layer includes: depositing an active layer film on the substrate; coating a layer of photoresist on the active layer film, exposing the photoresist by using a single-tone mask and developing, forming an unexposed region at a position of the pattern of the active layer, retaining the photoresist in the unexposed region, forming fully exposed regions at other positions, and removing the photoresist in the fully exposed regions; etching the active layer film at the fully exposed regions and stripping the remaining photoresist, and forming the pattern of the active layer 21 on the substrate 10, as shown in FIG. 2. For example, the substrate may be made of a flexible material, the active layer film may be made of a metal oxide or a silicon material, and a thickness of the active layer film is from about 300 Å to about 1000 Å. The metal oxide includes indium gallium zinc oxide (IGZO) or indium tin zinc oxide (ITZO). The silicon material includes amorphous silicon and polycrystalline silicon. The active layer film can also be made of amorphous silicon a-Si, and the polycrystalline silicon is formed by a process of crystallization or a process of laser annealing.

In an example, a light shielding layer pattern and a buffer layer pattern may further be arranged, the light shielding layer is configured to block light transmitted from a side of the substrate and improve the electrical performance of a thin film transistor, and the buffer layer is configured to block the effect of ions in the substrate on a thin film transistor. For example, a pattern of the light-shielding layer is formed on the substrate by a patterning process firstly, then depositing the buffer layer film and the active layer film in sequence, and forming the pattern of the active layer on the buffer layer by a patterning process.

Figure 3:
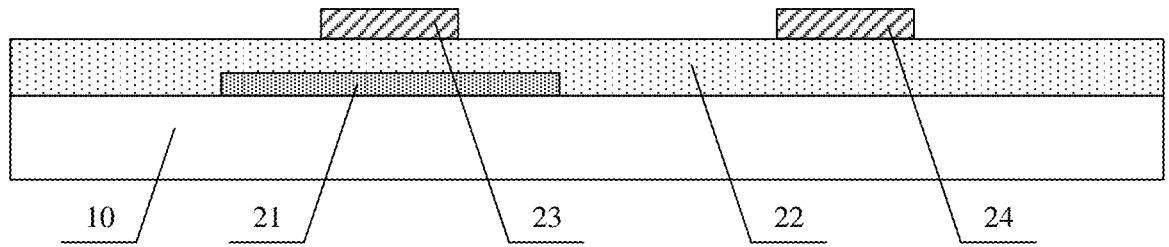
FIG. 3 is a schematic cross-section view of the display panel after a pattern of a gate electrode and a first lead wire are formed according to an embodiment of the present disclosure.

Subsequently, patterns of the gate electrode and the first lead wire are formed. Forming the patterns of the gate electrode and the first lead wire includes: depositing an insulating layer film and a metal film in sequence on the substrate formed with the pattern of the active layer, patterning the metal film by a patterning process, and forming the patterns of the first insulating layer 22, the gate electrode 23, and the first lead wire 24. The gate electrode 23 and the first lead wire 24 are formed on the first insulating layer 22, and a position of the gate electrode 23 corresponds to a position of the active layer 21, as shown in FIG. 3. For example, the metal film may be one or more of platinum (Pt), ruthenium (Ru), gold (Au), silver (Ag), molybdenum (Mo), chromium (Cr), aluminum (Al), tantalum (Ta), titanium (Ti), tungsten (W), etc., or a composite layer structure of multiple metals. A thickness of the metal film is from about 1000 Å to about 4000 Å. For example, the first insulating layer may be made of silicon nitride SiNx, silicon oxide SiOx, or a composite thin film of SiNx/SiOx, and a thickness of the first insulating layer is from about 1000 Å to about 3000 Å.

Figure 4:
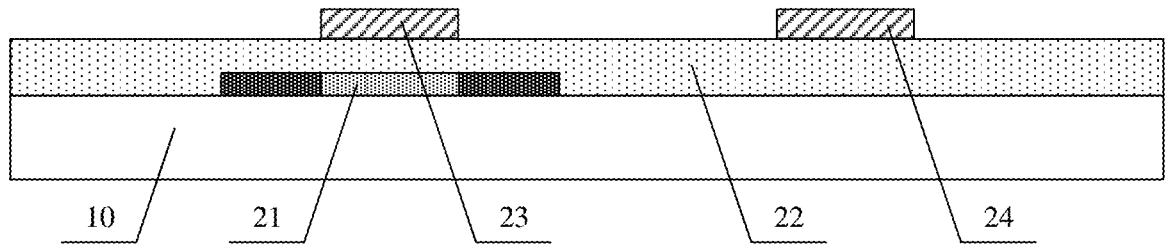
FIG. 4 is a schematic cross-section view of the display panel after a pattern of an active layer doped region is formed according to an embodiment of the present disclosure.

Subsequently, a pattern of an active layer doped region is formed. Forming the pattern of the active layer doped region includes: performing an ion doping process in a region of the active layer 21 that is not blocked by the gate electrode 23 to form a pattern of the active layer doped region, as shown in FIG. 4. In the process of ion doping, due to the barrier of the gate electrode 23, the affect of the doped ions on a channel region can be avoided. After the ion doping process is performed, the active layer outside the channel region becomes metal.

Figure 5:
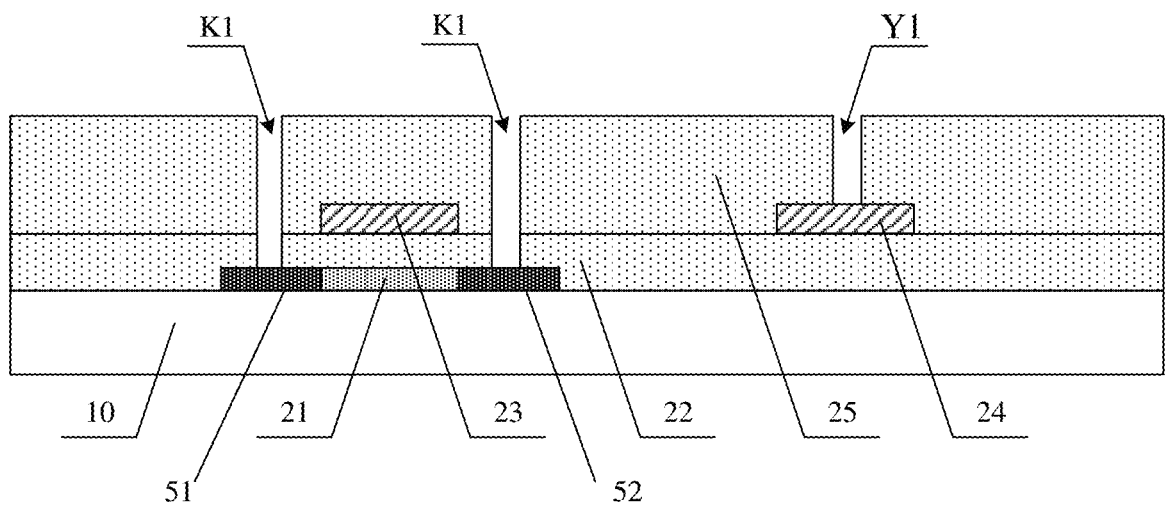
FIG. 5 is a schematic cross-section view of the display panel after a pattern of an insulating layer with a via hole is formed according to an embodiment of the present disclosure.

Subsequently, a pattern of an insulating layer provided with via holes is formed. Forming the pattern of the insulating layer provided with the via holes includes: depositing an insulating layer film on the substrate formed with the patterns mentioned above, coating a layer of the photoresist on the insulating layer film, exposing the photoresist by using a single-tone mask and developing, forming fully exposed regions at positions of the pattern of the via holes and removing the photoresist, forming unexposed regions at other positions and retaining the photoresist; etching the insulating layer film exposed in the fully exposed regions and striping the remaining photoresist, forming a pattern of a second insulating layer 25 provided with two first connection via holes K1 and one first lead via hole Y1, in which the two first connection via holes K1 are located in the doped region of the active layer 21, respectively, that is, the region where the active layer 21 is not blocked by the gate electrode 23, both the second insulating layer 25 and the first insulating layer 22 at the positions corresponding to the first connection via holes K1 are etched away, the doped regions 51 and 52 of the active layer 21 are exposed, the first lead via hole Y1 is located at a position of the first lead wire 24, the second insulating layer 25 at a position corresponding to the first lead via hole Y1 is etched away, and the first lead wire 24 is exposed, as shown in FIG. 5. For example, the second insulating layer may be made of SiNx, SiOx, or a composite film of SiNx/SiOx, and a thickness of the second insulating layer is from about 4000 Å to about 6000 Å.

Figure 6:
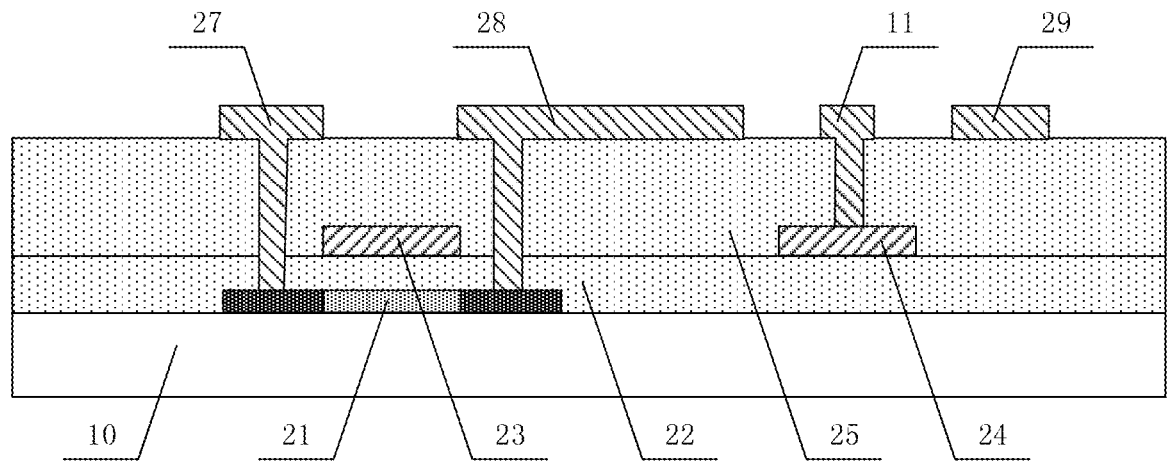
FIG. 6 is a schematic cross-section view of the display panel after a source electrode, a drain electrode, and a pattern of a first electrode are formed according to an embodiment of the present disclosure.

Subsequently, patterns of a source electrode, a drain electrode, a first electrode, and a third lead wire are formed. Forming the patterns of the source electrode, the drain electrode, the first electrode and the third lead wire includes: depositing a metal film on the substrate formed with the patterns mentioned above, patterning the metal film by a patterning process to form the patterns of the source electrode 27, the drain electrode 28, the first electrode 11 and the third lead wire 29. The source electrode 27 is connected with the doped region 51 of the active layer 21 through the first connection via hole K1, the drain electrode 28 is connected with the doped region 52 of the active layer 21 through the first connection via hole K1, and the first electrode 11 is connected with the first lead wire 24 through the first lead via hole Y1, as shown in FIG. 6. For example, all the source electrode, the drain electrode, the first electrode, and the third lead wire may be made of one or more of platinum (Pt), ruthenium (Ru), gold (Au), silver (Ag), molybdenum (Mo), chromium (Cr), aluminum (Al), tantalum (Ta), titanium (Ti), tungsten (W), etc., or a composite layer structure of multiple metals, and a thickness of each of the source electrode, the drain electrode, the first electrode and the third lead wire is from about 2000 Å to about 7000 Å.

Figure 7:
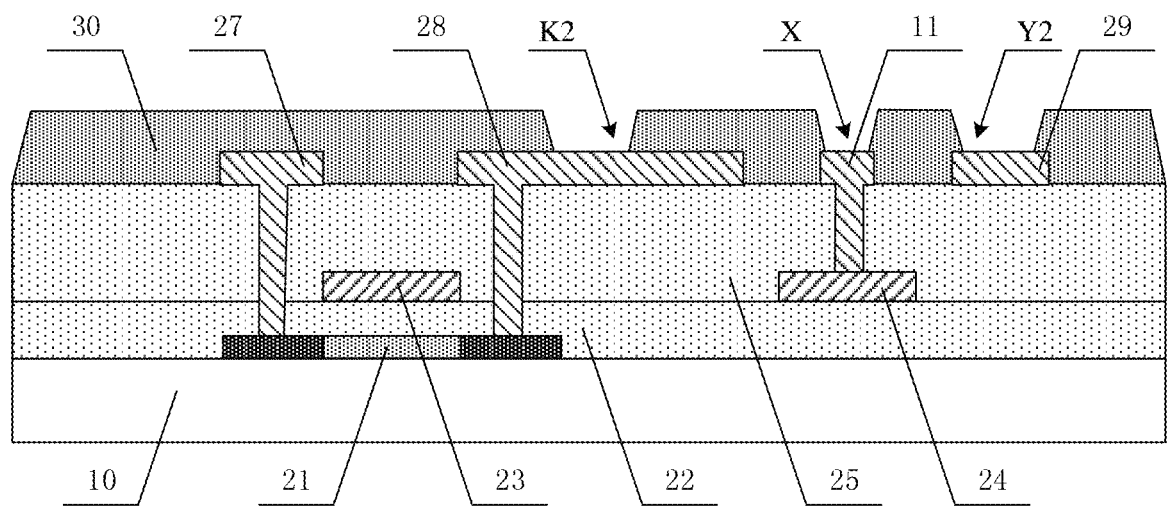
FIG. 7 is a schematic cross-section view of the display panel after a pattern of a planarization layer with a via hole is formed according to an embodiment of the present disclosure.

Subsequently, a pattern of a planarization layer provided with via holes is formed. Forming the pattern of the planarization layer provided with the via holes includes: applying a planarization (PLN) film by a coating process on the substrate formed with the patterns mentioned above, exposing and developing the planarization film to form the pattern of the planarization layer 30 formed with a second connection via hole K2, an electrode via hole X, and a second lead via hole Y2. The second connection via hole K2 is located at a position of the drain electrode 28, the electrode via hole X is located at a position of the first electrode 11, and the second lead via hole Y2 is located at a position of the third lead wire 29. The planarization film at positions corresponding to the second connection via hole K2, the electrode via hole X, and the second lead via hole Y2 are etched away, and the second connection via hole K2, the electrode via hole X, and the second lead via hole Y2 expose the drain electrode 28, the first electrode 11, and the third lead wire 29, respectively, as shown in FIG. 7. For example, the planarization film is made of a resin material, and a thickness of the planarization film is from about 1 μm to about 3 μm.

Figure 8:
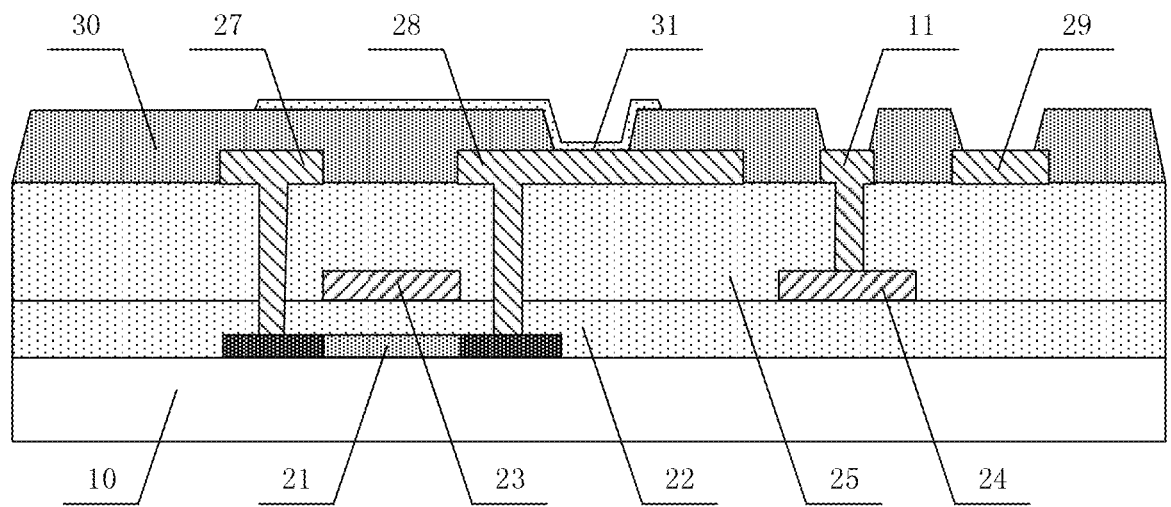
FIG. 8 is a schematic cross-section view of the display panel after a pattern of an anode is formed according to an embodiment of the present disclosure.

Subsequently, a pattern of an anode is formed. Forming the pattern of the anode includes: depositing a transparent conductive film on the substrate formed with the patterns mentioned above, patterning the transparent conductive film by a patterning process to form the pattern of the anode 31. The anode 31 is connected with the drain electrode 28 by the second connection via hole K2, as shown in FIG. 8. For example, the transparent conductive material layer is made of a material includes indium tin oxide ITO or indium zinc oxide IZO.

Figure 9:
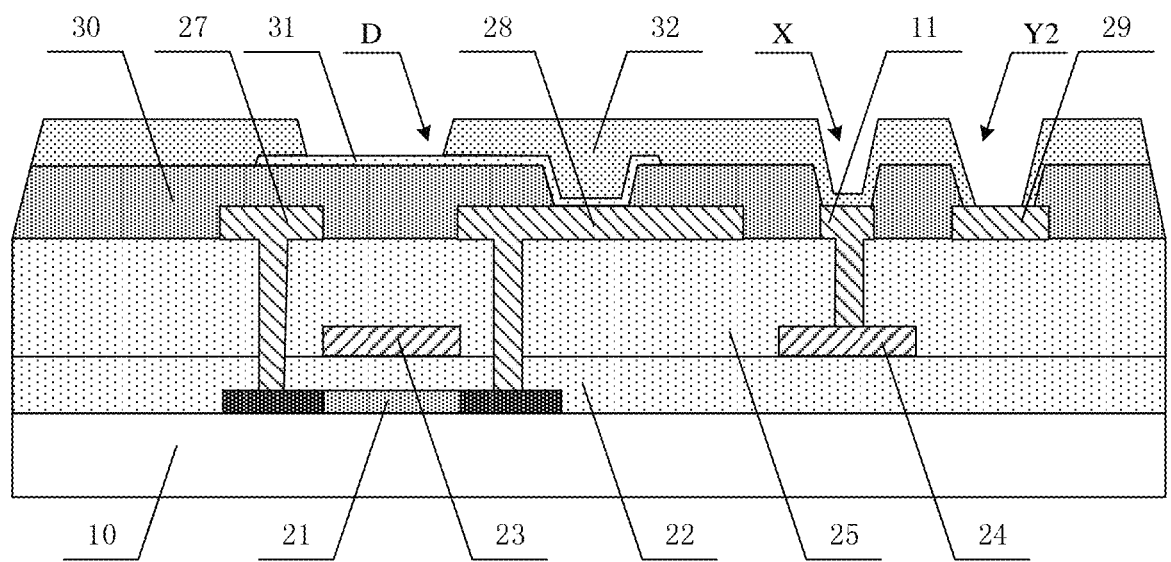
FIG. 9 is a schematic cross-section view of the display panel after a pattern of a dielectric layer with a via hole is formed according to an embodiment of the present disclosure.

Subsequently, a pattern of a dielectric layer provided with via holes is formed. Forming the pattern of the dielectric layer provided with the via holes includes: depositing a dielectric layer film on the substrate formed with the patterns mentioned above, patterning the dielectric layer film by a patterning process to form the pattern of the dielectric layer 32 provided with a pixel defining opening D, an electrode via hole X, and a second lead via hole Y2, in which the pixel definition opening D is located at the position of the anode 31, the dielectric layer film at a position corresponding to the pixel defining opening D is etched away to expose a surface of the anode 31. The electrode via hole X and the second lead via hole Y2 are processed on the via holes that have been formed in the previous processes, the electrode via hole X is located at the position of the first electrode 11, the second lead via hole Y2 is located at the position of the third lead wire 29, and the dielectric layer film at a position corresponding to the second lead via hole Y2 is etched away to expose a surface of the third lead wire 29, as shown in FIG. 9.

Figure 10:
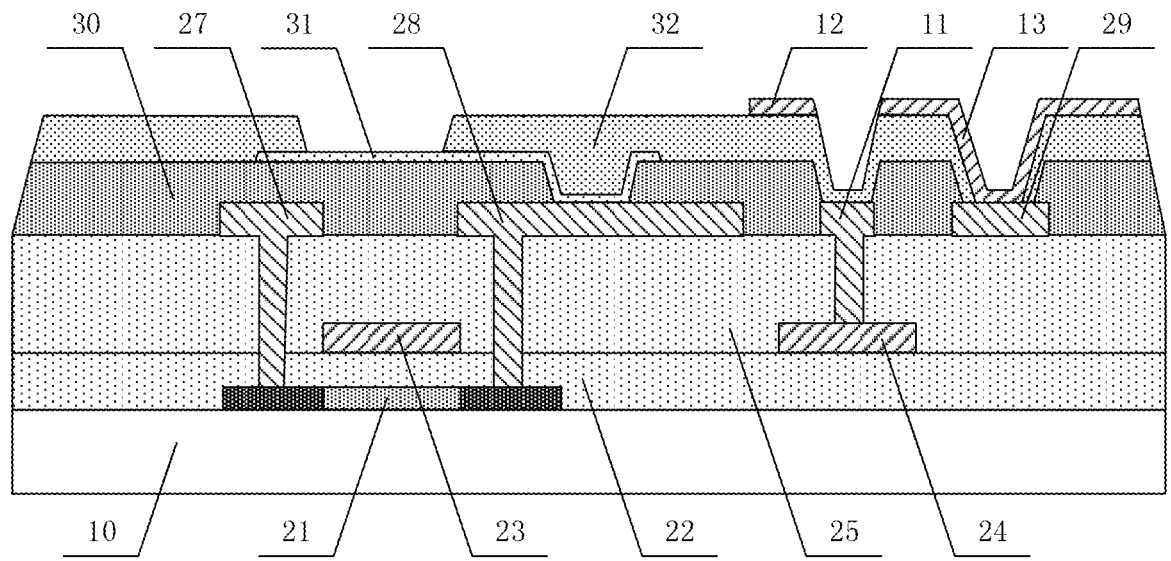
FIG. 10 is a a schematic cross-section view of the display panel after a pattern of a second electrode and a pattern of a third electrode are formed according to an embodiment of the present disclosure.

Subsequently, a pattern of a second electrode and a pattern of a third electrode are formed. Forming the pattern of the second electrode and the pattern of the third electrode includes: depositing a metal film on the substrate formed with the patterns mentioned above, patterning the metal film by a patterning process to form the pattern of the second electrode 12, the pattern of the third electrode 13, and a pattern of the second lead wire (not shown) on the dielectric layer 32. The second electrode 12 and the third electrode 13 are arranged on two sides of the electrode via hole on the first electrode 11, respectively, so that the first electrode 11, the second electrode 12, and the third electrode 13 form a substantially triangular layout, the second electrode 12 is directly connected with the second lead wire, and the third electrode 13 is connected with the third lead wire 29 through the second lead via hole Y2, as shown in FIG. 10.

Subsequently, a pattern of a pixel definition layer with an opening is formed. Forming the pattern of the pixel definition layer with the opening includes: applying a pixel definition layer (PDL) film by a process of coating on the substrate formed with the patterns mentioned above, exposing and developing to form the pattern of the pixel definition layer 33 with a pixel definition opening and an electrode via hole, in which the pixel definition opening is located at the position of the anode 31, the pixel definition layer film at a position corresponding to the pixel definition opening is etched away to expose the surface of the anode 31, and the electrode via hole X is located at the position of the first electrode 11, as shown in FIG. 1A and FIG. 1B.

By the manufacturing processes mentioned above, it realizes that the deformation sensing unit is organically integrated into the structure of an OLED display panel by a same manufacturing process. In an example, the subsequent step may further include a step of forming a light-emitting structure layer. The light-emitting structure layer includes structural layer films, such as a light-emitting layer, a cathode, an encapsulation layer. Further, for example, the subsequent step may further include a step of forming a touch structure layer. A panel with a touch function, a deformation sensing function and a display function is formed. The structure formed by the subsequent process and the manufacturing method of the subsequent process are the same as the structure and the manufacturing method of the related art, respectively, which are omitted herein.

In the manufacturing process mentioned above, the first connection via holes K1 are configured to connect the source electrode 27 with the doped region 51 of the active layer 21 and connect the drain electrode 28 with the doped region 52 of the active layer 21, respectively, the first lead via hole Y1 is configured to connect the first electrode 11 with the first lead wire 24, the second connection via hole K2 is configured to connect the anode 31 with the drain electrode 28, the electrode via hole X is configured to increase an amount of movement of the second electrode 12 and an amount of movement of the third electrode 13 under an external force, the second lead via hole Y2 is configured to connect the third electrode 13 with the third lead wire 29, and the pixel definition opening is configured to expose the anode 31.

Figure 11:
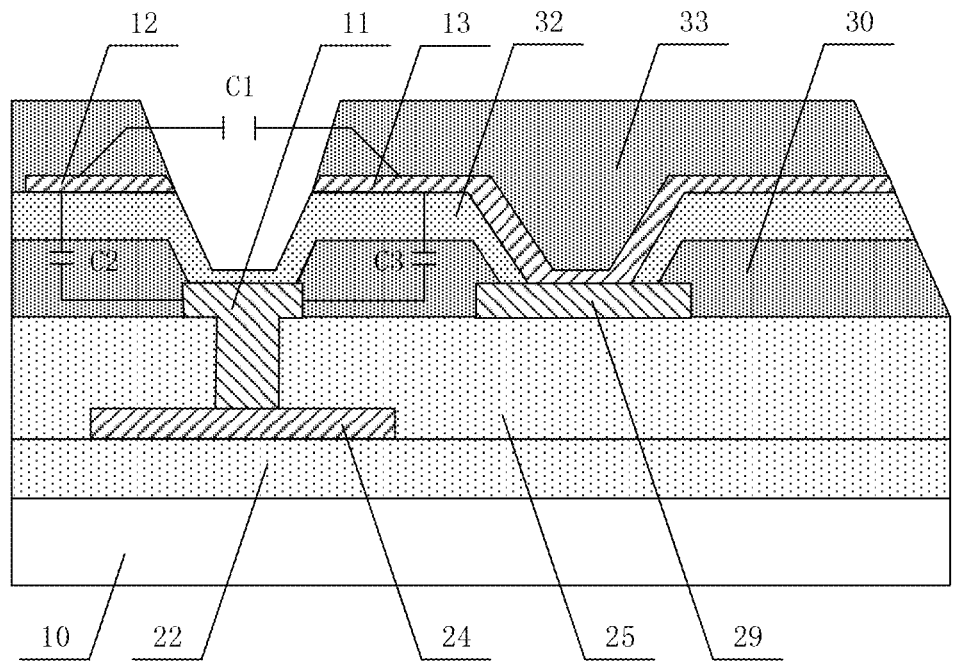
FIG. 11 is an enlarged diagram of a portion of the deformation sensing unit in FIG. 1A.

FIG. 11 is an enlarged diagram of a portion of the deformation sensing unit in FIG. 1A. As shown in FIG. 11, a first capacitor C1 is formed between the second electrode 12 and the third electrode 13, a second capacitor C2 is formed between the first electrode 11 and the second electrode 12, a third capacitor C3 is formed between the first electrode 11 and the third electrode 13, and the first capacitor, the second capacitor, and the third capacitor are also called as coupling capacitors. All the first lead wire 24, the second lead wire 26, and the third lead wire 29 are connected with an external processing module, so that the processing module inputs scanning signals to the first electrode 11, the second electrode 12, and the third electrode 13 through the first lead wire 24, the second lead wire 26, and the third lead wire 29 respectively, and receives induction signals, detects the capacitance values of the first capacitor C1, the second capacitor C2, and the third capacitor C3, to obtain the change relationship of the capacitance values, and determines the shape-state of the display panel based on the change relationship of the capacitance values. For example, the shape-state of the display panel includes one or any combination of the following: a horizontally stretched shape-state, a horizontally compressed shape-state, an inwardly bent shape-state, an outwardly bent shape-state, or a vertically compressed shape-state, etc.

For example, the processing module inputting scanning signals to each of the electrodes, receiving induction signals, and obtaining the capacitance values of each of the capacitors, are mature processing processes in related technologies, and are known to those skilled in the art, which are omitted herein.

Figure 12:
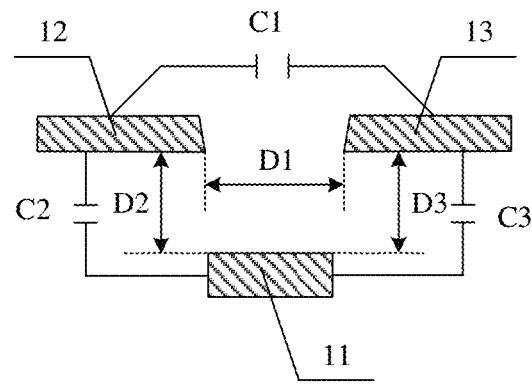
FIG. 12 is a schematic cross-section diagram of a deformation sensing unit after a capacitor is formed along the line AA' in FIG. 1B according to an embodiment of the present disclosure.

FIG. 12 is a schematic diagram that capacitors are formed in a deformation sensing unit according to an embodiment of the present disclosure. As shown in FIG. 12, the first electrode 11, the second electrode 12, and the third electrode 13 in the deformation sensing unit can form three capacitors. For example, the first capacitor C1 is formed between the second electrode 12 and the third electrode 13, the second capacitor C2 is formed between the first electrode 11 and the second electrode 12, the third capacitor C3 is formed between the first electrode 11 and the third electrode 13. In a case that the display panel changes its shape due to an external force, such as bending, stretching and compressing, etc., the external force moves some electrodes or all of the electrodes in the deformation sensing unit, so that a distance between the electrodes is increased or decreased, and further the capacitance values of some capacitors or all of the capacitors are changed; the external processing module applies scanning signals to each of the electrodes, detects the capacitance values of the first capacitor, the second capacitor, and the third capacitor, obtains the change relationship of the three capacitance values, and the shape-state of the display panel can be determined based on the change relationship of the three capacitance values. The shape-state of the display panel includes one or any combination of the following: a horizontally stretched shape-state generated by a horizontal tensile force, a horizontally compressed shape-state generated by a horizontal compression force, an inwardly bent shape-state and an outwardly bent shape-state generated by a bending moment, a vertically compressed shape-state generated by a vertical compression force, and so on.

A working principle of the deformation sensing unit in the embodiment of the present disclosure is described in detail in the following.

In the embodiments of the present disclosure, the horizontal direction refers to a direction parallel to a plane of the display panel, the vertical direction refers to a normal direction of the plane of the display panel. As shown in FIG. 12, in a case that the display panel is not subjected to any external force, in the horizontal direction, a first distance D1 is between the second electrode 12 and the third electrode 13, and a first capacitor C1 is formed between the second electrode 12 and the third electrode 13, the processing module applies scanning signals to the second electrode 12 and the third electrode 13, the capacitance value of the first capacitor C1 that can be detected is $Q_{C1}$, $Q_{C1}$ can be used as a reference capacitance value of the first capacitor C1. In the vertical direction, a second distance D2 is between the first electrode 11 and the second electrode 12, a second capacitor C2 is formed between the first electrode 11 and the second electrode 12, the processing module applies scanning signals to the first electrode 11 and the second electrode 12, the capacitance value of the second capacitor C2 that can be detected is $Q_{C2}$, $Q_{C2}$ can be used as a reference capacitance value of the second capacitor C2. In the vertical direction, a third distance D3 is between the first electrode 11 and the third electrode 13, a third capacitor C3 is formed between the first electrode 11 and the third electrode 13, the processing module applies scanning signals to the first electrode 11 and the third electrode 13, and the capacitance value of the third capacitor C3 that can be detected is $Q_{C3}$. $Q_{C3}$ can be used as a reference capacitance value of the third capacitor C3.

Figure 13:
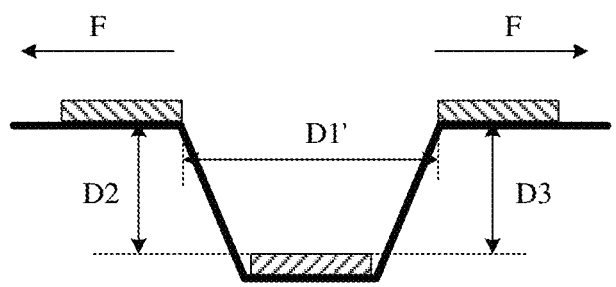
FIG. 13 is a schematic diagram of a deformation sensing unit subjected to a horizontal tensile force according to an embodiment of the present disclosure.

FIG. 13 is a schematic diagram of a deformation sensing unit subjected to a horizontal tensile force according to an embodiment of the present disclosure. As shown in FIG. 13, in a case that the deformation sensing unit is subjected to a horizontal tensile force F, the horizontal tensile force F increases the distance between the second electrode 12 and the third electrode 13, and the distance changes from the first distance D1 to D1', D1'>D1, and a basic distance between the first electrode 11 and the second electrode 12 and a basic distance between the first electrode 11 and the third electrode 13 are unchanged. At this time, the capacitance value $Q_{C1}'$ of the first capacitor C1 detected by the processing module is less than the reference capacitance value $Q_{C1}$ of the first capacitor C1, while the detected capacitance value $Q_{C2}'$ of the second capacitor C2 is approximately equal to the reference capacitance value $Q_{C2}$ of the second capacitor C2, and the detected capacitance value $Q_{C3}'$ of the third capacitor C3 is approximately equal to the reference capacitance value $Q_{C3}$ of the third capacitor C3.

Figure 14:
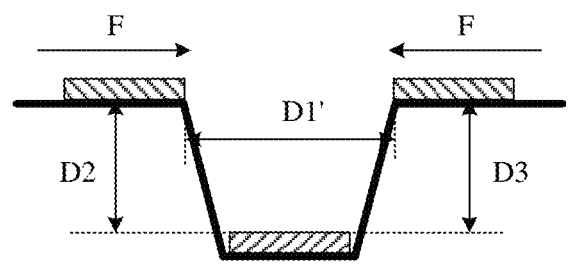
FIG. 14 is a schematic diagram of a deformation sensing unit subjected to a horizontal compression force according to an embodiment of the present disclosure.

FIG. 14 is a schematic diagram of the deformation sensing unit subjected to a horizontal compression force according to an embodiment of the present disclosure. As shown in FIG. 14, in a case that the deformation sensing unit is subjected to a horizontal compression force F, the horizontal compression force F decreases the distance between the second electrode 12 and the third electrode 13, and the distance changes from the first distance D1 to D1', D1'<D1, and the basic distance between the first electrode 11 and the second electrode 12 and the basic distance between the first electrode 11 and the third electrode 13 are unchanged. At this time, the capacitance value $Q_{C1}'$ of the first capacitor C1 detected by the processing module is greater than the reference capacitance value $Q_{C1}$ of the first capacitor C1, while the detected capacitance value $Q_{C2}'$ of the second capacitor C2 is approximately equal to the reference capacitance value $Q_{C2}$ of the second capacitor C2, and the detected capacitance value $Q_{C3}'$ of the third capacitor C3 is approximately equal to the reference capacitance value $Q_{C3}$ of the third capacitor C3.

Figure 15:
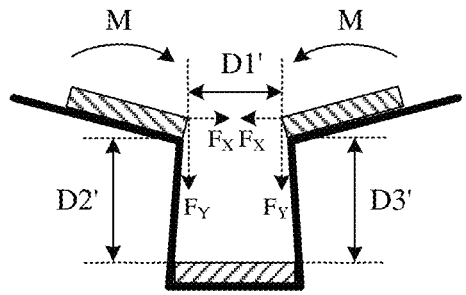
FIG. 15 is a schematic diagram of a deformation sensing unit subjected to an internal bending force according to an embodiment of the present disclosure.

FIG. 15 is a schematic diagram of a deformation sensing unit subjected to an internal bending force according to an embodiment of the present disclosure. As shown in FIG. 15, in a case that the deformation sensing unit is subjected to a bending moment M to the center of the deformation sensing unit downwardly, the bending moment M forms a horizontal compression force $F_X$ in the horizontal direction, so that the distance between the second electrode 12 and the third electrode 13 is decreased, the distance changes from the first distance D1 to D1', D1'<D1, and the bending moment M forms a vertical compression force $F_Y$ in the vertical direction, so that the distance between the first electrode 11 and the second electrode 12 is decreased, the distance changes from the second distance D2 to D2', D2'<D2, at the same time, the distance between the first electrode 11 and the third electrode 13 is decreased, the distance changes from the third distance D3 to D3', D3'<D3. Due to the bending moment M, the display panel has a concave and curved shape with a low center and two high sides. At this time, the capacitance value $Q_{C1}'$ of the first capacitor C1 detected by the processing module is greater than the reference capacitance value $Q_{C1}$ of the first capacitor C1, the detected capacitance value $Q_{C2}'$ of the second capacitor C2 is greater than the reference capacitance value $Q_{C2}$ of the second capacitor C2, and the detected capacitance value $Q_{C3}'$ of the third capacitor C3 is greater than the reference capacitance value $Q_{C3}$ of the third capacitor C3.

Figure 16:
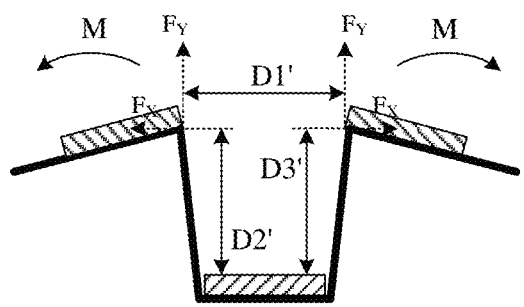
FIG. 16 is a schematic diagram of the deformation sensing unit subjected to an external bending force according to an embodiment of the present disclosure.

FIG. 16 is a schematic diagram of the deformation sensing unit subjected to an external bending force according to an embodiment of the present disclosure. As shown in FIG. 16, in a case that the deformation sensing unit is subjected to a bending moment M to the center of the deformation sensing unit upwardly, the bending moment M forms a horizontal tensile force $F_X$ in the horizontal direction, so that the distance between the second electrode 12 and the third electrode 13 is increased, the distance changes from the first distance D1 to D1', D1'>D1, while the bending moment M forms a vertical tensile force $F_Y$ in the vertical direction, so that the distance between the first electrode 11 and the second electrode 12 is increased, the distance changes from the second distance D2 to D2', D2'>D2, at the same time, the distance between the first electrode 11 and the third electrode 13 is increased, the distance changes from the third distance D3 to D3', D3'>D3. Due to the bending moment M, the display panel has a convex and curved shape with a high center and two low sides. At this time, the capacitance value $Q_{C1}'$ of the first capacitor C1 detected by the processing module is less than the reference capacitance value $Q_{C1}$ of the first capacitor C1, the detected capacitance value $Q_{C2}'$ of the second capacitor C2 is less than the reference capacitance value $Q_{C2}$ of the second capacitor C2, and the detected capacitance value $Q_{C3}'$ of the third capacitor C3 is less than the reference capacitance value $Q_{C3}$ of the third capacitor C3.

Figure 17:
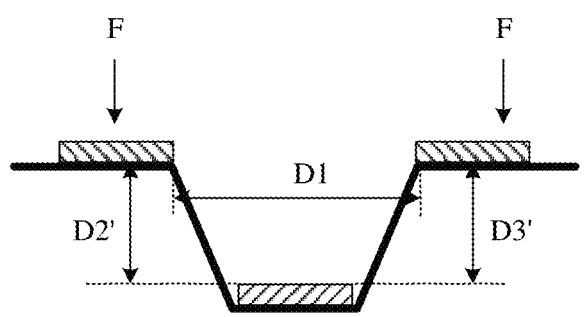
FIG. 17 is a schematic diagram of a deformation sensing unit subjected to a vertical compression force according to an embodiment of the present disclosure.

FIG. 17 is a schematic diagram of a deformation sensing unit subjected to a vertical compression force according to an embodiment of the present disclosure. As shown in FIG. 17, in a case that the deformation sensing unit is subjected to a vertical compression force F in the vertical direction, the vertical compression force F decreases the distance between the first electrode 11 and the second electrode 12, the distance changes from the second distance D2 to D2', D2'<D2, and the distance between the first electrode 11 and the third electrode 13 is decreased, the distance changes from the third distance D3 to D3', D3'<D3, while the first distance D1 between the second electrode 12 and the third electrode 13 does not change. At this time, the capacitance value $Q_{C1}'$ of the first capacitor C1 detected by the processing module is substantially equal to the reference capacitance value $Q_{C1}$ of the first capacitor C1, the detected capacitance value $Q_{C2}'$ of the second capacitor C2 is greater than the reference capacitance value $Q_{C2}$ of the second capacitor C2, and the detected capacitance value $Q_{C3}'$ of the third capacitor C3 is greater than the reference capacitance value $Q_{C3}$ of the third capacitor C3.

From the working principle of the deformation sensing unit illustrated in FIG. 13 to FIG. 17, the shape-states presented by the display panel correspond to the types of the external forces it receives one by one, and the external forces received by the display panel correspond to the change relationships of the capacitance values of the capacitors in the deformation sensing unit one by one, so, by detecting the capacitance values of the capacitors in the deformation sensing unit, the shape-state of the display panel can be determined according to the change relationship of the capacitance values of the various capacitors.

Table 1 shows a relationship between the change relationship of the capacitance values of the deformation sensing unit and the shape-state of the display panel.

TABLE 1

Relationship between the change relationship of the capacitance values of the deformation sensing unit and the shape-state of the display panel

| $Q_{C1}$ | $Q_{C2}$ | $Q_{C3}$ | D1 | D2 | D3 | Shape-state |
|---|---|---|---|---|---|---|
| decrease | unchanged | unchanged | increase | unchanged | unchanged | horizontally stretched |
| increase | unchanged | unchanged | decrease | unchanged | unchanged | horizontally compressed |
| increase | increase | increase | decrease | decrease | decrease | inwardly bent |

TABLE 1-continued

Relationship between the change relationship of the capacitance values of the deformation sensing unit and the shape-state of the display panel

| $Q_{C1}$ | $Q_{C2}$ | $Q_{C3}$ | D1 | D2 | D3 | Shape-state |
|---|---|---|---|---|---|---|
| decrease | decrease | decrease | increase | increase | increase | outwardly bent |
| unchanged | increase | increase | unchanged | decrease | decrease | vertically compressed |

As shown in Table 1, the following can be seen:

1. In a case that the processing module detects that the capacitance value $Q_{C1}$ of the first capacitor C1 decreases, and the capacitance values of the second capacitor C2 and the third capacitor C3 are basically unchanged, it represents that the first distance D1 between the second electrode and the third electrode increases, and the second distance D2 between the first electrode and the second electrode and the third distance D3 between the first electrode and the third electrode are substantially unchanged, thus it can be determined that the deformation sensing unit is subjected to a horizontal tensile force, and the display panel is in a horizontally stretched shape-state.

2. In a case that the processing module detects that the capacitance value $Q_{C1}$ of the first capacitor C1 increases, and the capacitance values of the second capacitor C2 and the third capacitor C3 are basically unchanged, it represents that the first distance D1 between the second electrode and the third electrode decreases, and the second distance D2 between the first electrode and the second electrode and the third distance D3 between the first electrode and the third electrode are substantially unchanged, thus it can be determined that the deformation sensing unit is subjected to a horizontal compression force, and the display panel is in a horizontally compressed shape-state.

3. In a case that the processing module detects that all the capacitance values of the first capacitor C1, the second capacitor C2, and the third capacitor C3 are increased, it represents that all the first distance D1, the second distance D2, and the third distance D3 are decreased, thus it can be determined that the deformation sensing unit is subjected to an inward bending force, and the display panel is in an inwardly bent shape-state.

4. In a case that the processing module detects that all the capacitance values of the first capacitor C1, the second capacitor C2, and the third capacitor C3 are decreased, it represents that all the first distance D1, the second distance D2 and the third distance D3 are increased, thus it can be determined that the deformation sensing unit is subjected to an external bending force, and the display panel is in an outwardly bent shape-state.

5. In a case that the processing module detects that the capacitance value of the first capacitor C1 is basically unchanged, but the capacitance values of both the second capacitor C2 and the third capacitor C3 increase, it represents that the first distance D1 is basically unchanged, both the second distance D2 and the third distance D3 are decreased, thus it can be determined that the deformation sensing unit is subjected to a vertical compression force, and the display panel is in a vertically compressed shape-state.

In the embodiment of the present disclosure, the external processing module applies scanning signals to each of the electrodes through signal lines to detect the capacitance values of each of the capacitors, and relevant technical ways can be used, which are omitted herein. In order to improve the accuracy of determining the change of the capacitance values, the embodiment of the present disclosure introduces a concept of a change threshold $\Delta$, a change threshold $\Delta 1$ of the first capacitor C1, a change threshold $\Delta 2$ of the second capacitor C2, and a change threshold $\Delta 3$ of the third capacitor C3 are set in advance. In a case that the change of the capacitance value is less than the change threshold $\Delta$, it is considered that the change of the capacitance value is caused by system noise, only in a case that an amount of the change of the capacitance value is greater than or equal to the change threshold $\Delta$, it is considered that the change of the capacitance value is caused by an external force. In the embodiment of the present disclosure, $\Delta 1=(0.02\sim0.1) Q_{C1}$, $42=(0.02\sim0.1) Q_{C2}$, and $\Delta 3=(0.02\sim0.1) Q_{C3}$ are set. For example, different thresholds A can be set, or the threshold can be set as 0, the embodiments of the present disclosure are not limited thereto.

In an example, the processing module may determine the change of the capacitance value by the method that determining whether an absolute value of the amount of the change of the capacitance value is greater than the change threshold $\Delta$ firstly, and then determining a change nature of the capacitance value. In the embodiment, the change nature refers to that the capacitance value is increased or the capacitance value is decreased. For example, after detecting the capacitance values of the three capacitors, the processing module determines the absolute values of the amount of the changes of the three capacitance values, that is, determining the absolute values of $|Q_{C1}'-Q_{C1}, Q_{C2}'-Q_{C2}|, Q_{C3}'-Q_{C3}|$, respectively, if $|Q_{C1}'-Q_{C1}|\geq\Delta 1$, $|Q_{C2}'-Q_{C2}|<\Delta 2$ and $|Q_{C3}'-Q_{C3}|<\Delta 3$, it is considered that the capacitance value of the second capacitor and the capacitance value of the third capacitor are unchanged, only the capacitance value of the first capacitor changes, then continue to determine the values of $Q_{C1}'$ and $Q_{C1}$. In a case that $Q_{C1}'<Q_{C1}$, it is determined that the deformation sensing unit is subjected to a horizontal tensile force, and the display panel is in a horizontally stretched shape-state.

In an example, the second electrode and the third electrode can be arranged symmetrically with respect to the position of the first electrode, that is, the second distance D2 between the first electrode and the second electrode is equal to the third distance D3 between the first electrode and the third electrode, in this way, after detecting the capacitance values of the three capacitors, the processing module only needs to determine the change relationship between the capacitance values of the first capacitor C1 and the second capacitor C2, then it can determine the shape-state of the display panel. The change relationship between the capacitance values of the first capacitor C1 and the third capacitor C3 can also be determined. Table 2 shows the relationship of determining the shape-state of the display panel by using the capacitor C1 and the capacitor C2.

TABLE 2

Relationship of determining the shape-state of the display panel by using the capacitor C1 and the capacitor C2

| $Q_{C1}$ | $Q_{C2}$ | D1 | D2 | Shape-state |
|---|---|---|---|---|
| decrease | unchanged | increase | unchanged | horizontally stretched |
| increase | unchanged | decrease | unchanged | horizontally compressed |
| increase | increase | decrease | decrease | inwardly bent |
| decrease | decrease | increase | increase | outwardly bent |
| unchanged | increase | unchanged | decrease | vertically compressed |

Although the above descriptions only describe the judgment of the horizontally stretched shape-state, the horizontally compressed shape-state, the inwardly bent shape-state, the outwardly bent shape-state, or the vertically compressed shape-state, the technical schemes in the embodiments of the present disclosure can also implement the judgment of other shape-states of the display panel based on the technical concepts of the embodiments of the present disclosure. For example, the inwardly bent shape-state can be determined by comparing the reduction in the capacitance values of the second capacitor C2 and the third capacitor C3, that is, comparing the values of $|Q_{C2}'-Q_{C2}|$ and $|Q_{C3}'-Q_{C3}|$ to determine the reduction extent of the second distance D2 and the third distance D3, so as to determine the bending extent of the two sides of the display panel in the inwardly bent shape-state. For another example, a twisted shape-state of the display panel can also be determined by the shape-states of two or more of the deformation sensing units.

Although the above descriptions have been described with a structure that three electrodes form three capacitors, based on the technical concepts of the embodiments of the present disclosure, the technical scheme of the embodiment of the present disclosure can also be simplified into a structure that two electrodes form a capacitor, so as to realize the judgment of a part of the shape-states. For example, only the second electrode and the third electrode are arranged to realize the judgment of the horizontally stretched shape-state and the horizontally compressed shape-state. For another example, only the first electrode and the second electrode are arranged to realize the judgment of the vertically compressed shape-state. At the same time, the technical schemes in the embodiments of the present disclosure can also be extended to a structure in which four electrodes, five electrodes, or even more electrodes form a plurality of capacitors to achieve the judgments of more shape-states.

An embodiment of the present disclosure also provides a display panel, by integrating the deformation sensing unit in the structure of the display panel, using the change relationship of the capacitance values in the deformation sensing unit to reflect the shape-state of the display panel, and using a built-in structure of the deformation sensing unit, the problem of damaging the sensors in use is avoided, the product reliability of the display panel is maximized, and the display panel can be manufactured by using the production equipment in the art without adding new production equipment, the production cost of the display panel is low, and the application prospect of the display panel is wide. The display panel in the embodiment of the present disclosure can not only determine the inwardly bent shape-state and the outwardly bent shape-state, but also the horizontally stretched shape-state, the horizontally compressed shape-state, and the vertically compressed shape-state, and more abundant input commands can be realized, more application programs can be controlled, the structure of the display panel is simple, and the deformation sensing unit is easy to be integrated in the display panel. In the display panel provided by the embodiments of the present disclosure, the electrodes and the lead wires of the electrodes of the deformation sensing unit are reasonably arranged in the corresponding film layers of the display panel, the display panel can be manufactured by using the production equipment in the art without adding new production equipment, the production cost is low, and the changes of the structural film layers in the display panel are small, the integration is high, the layout is reasonable, less film layers are added, and the structure is simple, which is easy to implement.

Although the above descriptions have been described with a structure of a top-gate thin film transistor, based on the technical concepts of the embodiments of the present disclosure, the technical schemes of the embodiments of the present disclosure are also applicable to a structure of a bottom-gate thin film transistor, each of the electrodes and the lead wires can also be arranged on other layers as requirements to form the required capacitors. Although the above descriptions have been described with a structure in which three electrodes form three capacitors, based on the technical concepts of the embodiments of the present disclosure, the technical schemes of the embodiments of the present disclosure can also be extended to a structure in which two electrodes, four electrodes, five electrodes, or even more electrodes to form one or a plurality of capacitors, to achieve the judgments of more shape-states.

In a case of determining the shape-state of the display panel in the embodiments of the present disclosure, the determining approaches shown in Table 2 may be used, only the change relationship of the capacitance values of the first capacitor C1 and the second capacitor C2 is used to determine the shape-state of the display panel. The third electrode 12 is connected with the third lead wire 29 through the via hole, while the first electrode 11 and the third lead wire 29 are arranged on a same layer, SO, when an external force is applied to the display panel, the distance between the first electrode 11 and the third electrode 13 is basically unchanged, thus the change of the third capacitor C3 is not necessary to be considered, and only the change relationship of the capacitance values of the first capacitor C1 and the second capacitor C2 required to be determined, that is, the processing module detects the capacitance values of the first capacitor C1 and the second capacitor C2 to obtain the change relationship of the capacitance values of the two capacitors and determine the shape-state of the display panel according to the changing relationship of the capacitance values of the two capacitors.

As shown in FIG. 1A to FIG. 10, the display panel in the embodiments of the present disclosure includes: the substrate 10; the active layer 21 arranged on the substrate 10; the first insulating layer 22 covering the active layer 21; the gate electrode 23 and the first lead wire 24 arranged on the first insulating layer 22; the second insulating layer 25 covering the gate electrode 23 and the first lead wire 24; the source electrode 27, the drain electrode 28, the first electrode 11, and the third lead wire 29 that are arranged on the second insulating layer 25, in which the source electrode 27 and the drain electrode 28 are connected with the active layer 21 by the first connection via holes, respectively, and the first electrode 11 is connected with the first lead wire 24 through the first lead via hole; the planarization layer 30 covering the source electrode 27, the drain electrode 28, the first electrode 11, and the third lead wire 29; the anode 31 arranged on the planarization layer 30, in which the anode 31 is connected with the drain electrode 28 through the second connection via hole; the dielectric layer 32 covering the anode 31, in which the pixel definition opening, the electrode via hole, and the second lead via hole are provided at the positions of the anode 31, the first electrode 11, and the third lead wire 29, respectively; the second electrode 12 and the third electrode 13 that are arranged on the dielectric layer 32, the second electrode 12 and the third electrode 13 are located on two sides of the electrode via hole, and the third electrode 13 is connected with the third lead wire 29 through the second lead via hole; and the pixel definition layer 33 covering the second electrode 12 and the third electrode 13, in which the pixel definition opening exposing the anode 31 is formed in the pixel definition layer 33.

For example, the display unit includes: the substrate 10; the active layer 21 arranged on the substrate 10; the first insulating layer 22 covering the active layer 21; the gate electrode 23 arranged on the first insulating layer 22, in which the gate electrode 23 and the first lead wire 24 of the deformation sensing unit are arranged on the same layer; the second insulating layer 25 covering the gate electrode 23; the source electrode 27 and the drain electrode 28 arranged on the second insulating layer 25, in which the source electrode 27 and the drain electrode 28 are connected with the doped regions of the active layer 21 through the first connection via holes, respectively, the source electrode 27 and the drain electrode 28 are arranged on the same layer as the first electrode 11 and the third lead wire 24 of the deformation sensing unit; the planarization layer 30 covering the source electrode 27 and the drain electrode 28; the anode 31 arranged on the planarization layer 30, in which the anode 31 is connected with the drain electrode 28 through the second connection via hole; and the dielectric layer 32 and the pixel definition layer 33 that cover the anode 31, in which the pixel definition opening exposing the anode 31 is formed in the dielectric layer 32 and the pixel definition layer 33.

For example, the deformation sensing unit includes: the substrate 10; the first insulating layer 22 covering the substrate 10; the first lead wire 24 arranged on the first insulating layer 22, in which the first lead wire 24 is arranged on the same layer as the gate electrode 23 of the display unit; the second insulating layer 25 covering the first lead wire 24; the first electrode 11 and the third lead wire 29 arranged on the second insulating layer 25, in which the first electrode 11 is connected with the first lead wire 24 through the first lead via hole, and the first electrode 11 and the third lead wire 29 are arranged on the same layer as the source electrode 27 and the drain electrode 28 of the display unit; the planarization layer 30 and the dielectric layer 32 that cover the first electrode 11, in which the electrode via hole and the second lead via hole are provided in both the planarization layer 30 and the dielectric layer 32 corresponding to the positions of the first electrode 11 and the third lead wire 29, respectively; the second electrode 12 and the third electrode 13 that are arranged on the dielectric layer 32, in which the second electrode 12 and the third electrode 13 are located on two sides of the electrode via hole, respectively, and the third electrode 13 is connected with the third lead wire 29 through the second lead via hole; and the pixel definition layer 33 covering the second electrode 12 and the third electrode 13.

Embodiments of the present disclosure provide a display panel, by integrating the deformation sensing unit in the structure of the display panel, not only the inwardly bent shape-state and the outwardly bent shape-state of the display panel can be determined, but also the horizontally stretched shape-state, the horizontally compressed shape-state and the vertically compressed shape-state of the display panel can be determined, more abundant input commands can be realized, and more application programs can be controlled. Because the deformation sensing unit is built into the OLED display panel, the display panel can be manufactured by using the production equipment in the art without adding new production equipment, the production cost of the display panel is low, and the built-in structure of the deformation sensing unit avoids the problem of the damaging the sensors in use, and the product reliability of the display panel is maximized. The electrodes and the lead wires of the electrodes of the deformation sensing unit are reasonably arranged in the corresponding film layers of the display panel, so that the change of each of the structural film layers in the display panel is small, the extent of integration of the display panel is high, the layout is reasonable, less film layers are added, and the structure is simple, which is easy to implement and has wide application prospect.

Figure 18:
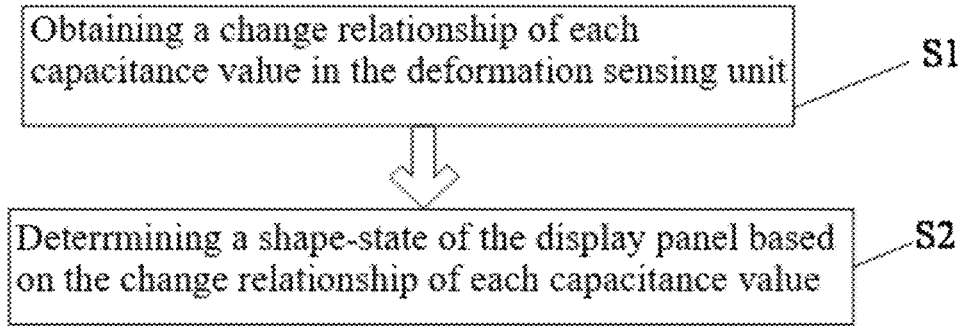
FIG. 18 is a flowchart of a deformation sensing method of a display panel according to an embodiment of the present disclosure.

Based on the technical concepts of the embodiments of the present disclosure, an embodiment of the present disclosure also provides a deformation sensing method of the display panel, which is realized based on the display panel mentioned. The display panel includes a plurality of pixel units arranged in a matrix, each of the pixel units is provided with a display unit and a deformation sensing unit that are formed by a same manufacturing process, the deformation sensing unit includes at least one capacitor formed by more than two electrodes. FIG. 18 is a flowchart of the deformation sensing method of the display panel according to an embodiment of the present disclosure. As shown in FIG. 18, the deformation sensing method of the display panel according to the embodiment of the present disclosure includes the following operations.

S1: obtaining a change relationship of each capacitance value in the deformation sensing unit.

S2: determining a shape-state of the display panel based on the change relationship of each capacitance value.

Figure 19:
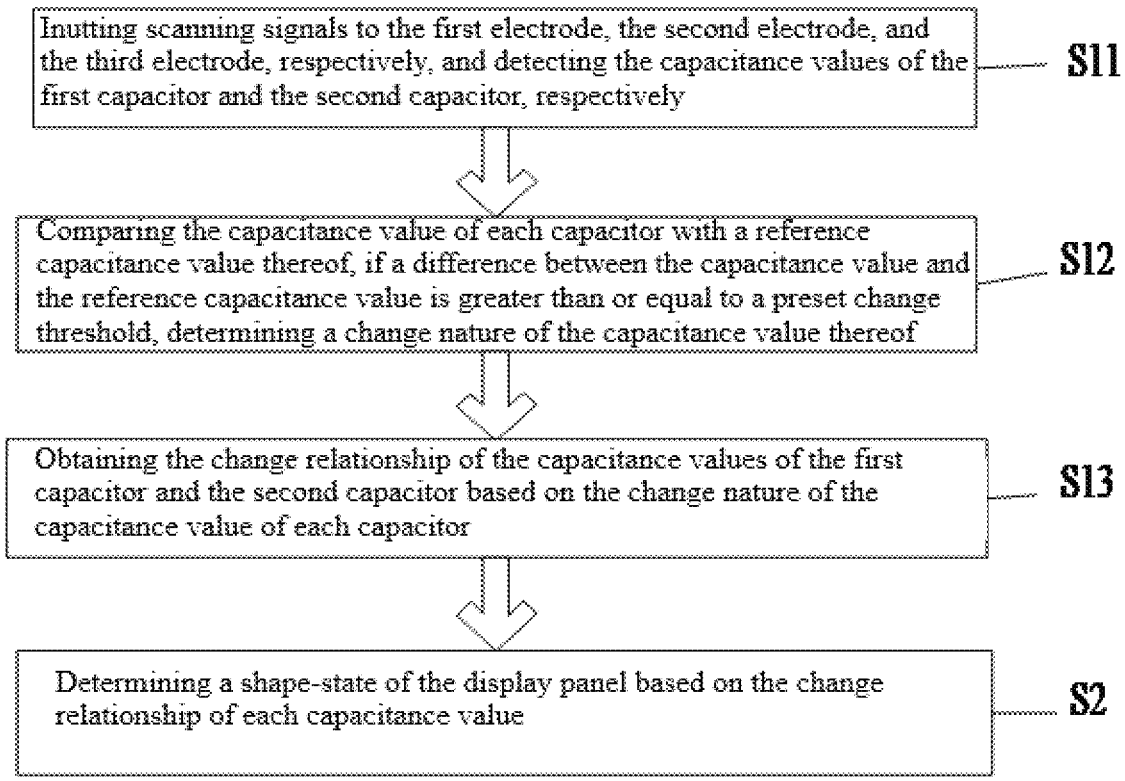
FIG. 19 is a flowchart of a deformation sensing method of a display panel according to another embodiment of the present disclosure.

For example, the deformation sensing unit includes a first electrode, a second electrode, and a third electrode, a first capacitor is formed between the second electrode and the third electrode, and a second capacitor is formed between the first electrode and the second electrode. As shown in FIG. 19, step S1 includes following operations.

S11: inputting scanning signals to the first electrode, the second electrode, and the third electrode, respectively, and detecting the capacitance value of the first capacitor and the capacitance value of the second capacitor, respectively.

S12: comparing the capacitance value of each capacitor with a reference capacitance value of this capacitor, if a difference between the capacitance value and the reference capacitance value is greater than or equal to a preset change threshold, determining a change nature of the capacitance value of each capacitor.

S13: obtaining the change relationship of the capacitance values of the first capacitor and the second capacitor based on the change nature of the capacitance value of each capacitor.

For example, the reference capacitance value is a capacitance value of each capacitor which is detected when the display panel is not subjected to any external force. The preset change threshold comprises a change threshold $\Delta 1$ of the first capacitor and a change threshold $\Delta 2$ of the second capacitor, $\Delta 1=(0.02 \sim 0.1)\ Q_{C_1}$, $\Delta 2=(0.02 \sim 0.1)\ Q_{C_2}$, where $Q_{C_1}$ and $Q_{C_2}$ are the reference capacitance values of the first capacitor and the reference capacitance value of the second capacitor, respectively.

For example, step S12 includes following operations.

S121: comparing $|Q_{C1}'-Q_{C1}|$ with $\Delta 1$ and comparing $|Q_{C2}'-Q_{C2}|$ with $\Delta 2$, respectively.

S122: if $|Q_{C1}'-Q_{C1}| \geq \Delta 1$ or $|Q_{C2}'-Q_{C2}| \geq \Delta 2$, comparing the values of $Q_{C1}'$ and $Q_{C1}$, or the values of $Q_{C2}'$ and $Q_{C2}$.

S123: based on the comparison results, determining the change nature of each of the capacitors, in which the change nature includes: increase in capacitance or decrease in capacitance.

For example, $Q_{C1}'$ and $Q_{C2}'$ are detection capacitance values of the first capacitor and the second capacitor, respectively.

For example, step S2 includes following operations.

In a case that the capacitance value $Q_{C1}$ of the first capacitor is decreased, and the capacitance value of the second capacitor is basically unchanged, it is determined that the deformation sensing unit is subjected to a tensile force in the horizontal direction, and the display panel is determined as in the horizontally stretched shape-state.

In a case that the capacitance value $Q_{C1}$ of the first capacitor is increased, and the capacitance value of the second capacitor is basically unchanged, it is determined that the deformation sensing unit is subjected to a compression force in the horizontal direction, and the display panel is determined as in the horizontally compressed shape-state.

In a case that both the capacitance value of the first capacitor and the capacitance value of the second capacitor are increased, it is determined that the deformation sensing unit is subjected to an internal bending force, and the display panel is determined as in the inwardly bent shape-state.

In a case that both the capacitance value of the first capacitor and the capacitance value of the second capacitor are decreased, it is determined that the deformation sensing unit is subjected to an external bending force, and the display panel is determined as in the outwardly bent shape-state.

In a case that the capacitance value of the first capacitor is basically unchanged and the capacitance value of the second capacitor is increased, it is determined that the deformation sensing unit is subjected to a compression force in the vertical direction, and the display panel is determined as in the vertically compressed shape-state.

For example, the internal bending force refers to that the display panel is subjected to a bending moment to the center of the display panel downwardly, and the inwardly bent shape-state refers to that the display panel has a concave and curved shape. The external bending force refers to that the display panel is subjected to a bending moment to the center of the display panel upwardly, and the outwardly bent form refers to that the display panel has a convex and curved shape.

In an implementation, the shape-state of the display panel may also be determined according to the change relationship of the capacitance values of the first capacitor, the second capacitor, and the third capacitor, as shown in Table 1.

An embodiment of the present disclosure provides the deformation sensing method of the display panel, by obtaining the change relationship of the capacitance values in each of the deformation sensing units to determine the shape-state of the display panel. The deformation sensing method of the display panel in the embodiments of the present disclosure can determine the inwardly bent shape-state and the outwardly bent shape-state of the display panel, and can determine the horizontally stretched shape-state, the horizontally compressed shape-state, the vertically compressed shape-state, and so on. In this way, more abundant input commands can be realized, more application programs can be controlled, and the determining way is simple, which can be realized by using the integrated circuit in the peripheral equipment in the art, and the application prospect of the deformation sensing method is wide.

Based on the technical schemes of the above embodiments, an embodiment of the present disclosure also provides a display device, and the display device includes the display panel mentioned. The display device can be any products or components with a display function, such as an OLED panel, a mobile phone, a tablet computer, a television, a display, a laptop, a digital photo frame, a navigator, etc.

In the description of the embodiments of the present disclosure, it should be understood that, the orientations or positional relationships indicated by the terms "middle", "up", "down", "front", "back", "vertical", "horizontal", "top", "bottom", "in" and "out", etc. are based on the orientations or positional relationships shown in the drawings, and are only for the convenience of describing the embodiments of the present disclosure and simplifying the description, rather than indicating or implying the device or the element must have a specific orientation, be constructed and operated in a specific orientation, so they should not be understood as a limitation of the present disclosure.

In the description of the embodiments of the present disclosure, it should be noted that, the terms "connected" and "connecting" should be understood in a broad sense, unless otherwise clearly specified and defined, for example, it may be a fixed connection or a detachable connection, or integrally connected; it can be mechanically connected or electrically connected; it can be directly connected or indirectly connected through an intermediary, or it can be a communication between inners of two components.

The embodiments of the present disclosure provide the display panel, its deformation sensing method and the display device, by integrating the deformation sensing unit in the structure of the display panel, using the change relationship of the capacitance values in the deformation sensing unit reflects the shape-state of the display panel, and using the built-in structure of the deformation sensing unit, the problem of damaging the sensors in use is avoided, the product reliability of the display panel is maximized, and the display panel can be manufactured by using the production equipment in the art without adding new production equipment, the production cost of the display panel is low, and the application prospect of the display panel is wide.

The following points required to be explained:

(1) The drawings of the embodiments of the present disclosure only relate to the structures related to the embodiments of the present disclosure, and other structures can refer to a common design.

(2) Without conflicting with each other, the embodiments of the present disclosure and the elements in the embodiments may be combined with each other to obtain new embodiments, and the new embodiments should belong to the scope of the present disclosure.

The description above is only exemplary embodiments of the present disclosure, and the scope of the present disclosure is not limited thereto. Any changes or substitutions readily conceived by one of ordinary skill in the art without departing the technical scope of the present embodiments, shall fall within the scope of the present disclosure.

What is claimed is:

1. A display panel, comprising,
a substrate;
a deformation sensing unit on the substrate;

wherein the deformation sensing unit comprises a first electrode, a second electrode, and a third electrode, the second electrode and the third electrode being configured to form a first capacitor, the first electrode and the second electrode being configured to form a second capacitor, the first electrode and the third electrode being configured to form a third capacitor, and the first capacitor, the second capacitor, and the third capacitor being configured to determine a shape-state of the display panel; and a display unit, wherein the display unit comprises a thin film transistor, the first electrode is arranged on a same layer as both a source electrode and a drain electrode of the thin film transistor, and both the second electrode and the third electrode are arranged on a dielectric layer covering the first electrode.

2. The display panel according to claim 1, wherein the dielectric layer is provided with an electrode via hole at a position of the first electrode, and the second electrode and the third electrode are arranged on the dielectric layer and arranged on two sides of the electrode via hole, respectively.

3. The display panel according to claim 1, wherein the first electrode, the second electrode, and the third electrode are respectively connected with a processing module, the processing module inputs scanning signals to the first electrode, the second electrode, and the third electrode, respectively, and detects a capacitance value of at least one of the first capacitor, the second capacitor, and the third capacitor to obtain a change relationship of the capacitance value, and determine the shape-state of the display panel according to the change relationship of the capacitance value.

4. The display panel according to claim 1, wherein the deformation sensing unit further comprises a first lead wire, a second lead wire, and a third lead wire; the first electrode is connected with the processing module through the first lead wire, the second electrode is connected with the processing module through the second lead wire, and the third electrode is connected with the processing module through the third lead wire, respectively; the first lead wire is arranged on a same layer as a gate electrode of the display unit, the first electrode is connected with the first lead wire through a first connection via hole; the second lead wire and the second electrode are arranged on a same layer, and the second lead wire is directly connected with the second electrode; the third lead wire is arranged on a same layer as both the source electrode and the drain electrode of the display unit, and the third electrode is connected with the third lead wire through a second lead via hole.

5. The display panel according to claim 1, wherein the deformation sensing unit comprises:
a first insulating layer covering the substrate;
a first lead wire arranged on the first insulating layer, wherein the first lead wire is arranged on a same layer as a gate electrode of the display unit;
a second insulating layer covering the first lead wire, wherein a first lead via hole exposing the first lead wire is arranged in the second insulating layer;
the first electrode and a third lead wire that are arranged on the second insulating layer, the first electrode is connected with the first lead wire through the first lead via hole, and both the first electrode and the third lead wire are arranged on a same layer as a source electrode and a drain electrode of the display unit;
a planarization layer and a dielectric layer covering both the first electrode and the third lead wire, wherein the planarization layer is provided with an electrode via hole and a second lead via hole at positions of the first electrode and the third lead wire, respectively, and the dielectric layer is provided with the electrode via hole and the second lead via hole at the positions of the first electrode and the third lead wire, respectively;
the second electrode and the third electrode arranged on the dielectric layer, wherein the second electrode and the third electrode are on two sides of the electrode via hole, respectively, and the third electrode is connected with the third lead wire through the second lead via hole; and
a pixel definition layer covering both the second electrode and the third electrode.

6. The display panel according to claim 1, wherein the display unit comprises:
an active layer arranged on the substrate;
a first insulating layer covering the active layer;
a gate electrode arranged on the first insulating layer, wherein the gate electrode and a first lead wire of the deformation sensing unit are arranged on a same layer;
a second insulating layer covering the gate electrode, wherein first connection via holes exposing the active layer are formed in the second insulating layer;
a source electrode and a drain electrode arranged on the second insulating layer, wherein the source electrode and the drain electrode are respectively connected with the active layer through the first connection via holes, and the source electrode and the drain electrode are arranged on a same layer as both the first electrode and a third lead wire of the deformation sensing unit;
a planarization layer covering the source electrode and the drain electrode, wherein a second connection via hole exposing the drain electrode is formed in the planarization layer;
an anode arranged on the planarization layer, wherein the anode is connected with the drain electrode through the second connection via hole; and
a dielectric layer and a pixel definition layer covering the anode, wherein a pixel definition opening exposing the anode is formed in the pixel definition layer.

7. The display panel according to claim 1, wherein the substrate is a flexible substrate.

8. The display panel according to claim 2, wherein the first electrode, the second electrode, and the third electrode are respectively connected with a processing module, the processing module inputs scanning signals to the first electrode, the second electrode, and the third electrode, respectively, and detects a capacitance value of at least one of the first capacitor, the second capacitor, and the third capacitor to obtain a change relationship of the capacitance value, and determine the shape-state of the display panel according to the change relationship of the capacitance value.

9. The display panel according to claim 8, wherein the deformation sensing unit further comprises a first lead wire, a second lead wire, and a third lead wire; the first electrode is connected with the processing module through the first lead wire, the second electrode is connected with the processing module through the second lead wire, and the third electrode is connected with the processing module through the third lead wire, respectively; the first lead wire is arranged on a same layer as a gate electrode of the display unit, the first electrode is connected with the first lead wire through a first connection via hole; the second lead wire and the second electrode are arranged on a same layer, and the second lead wire is directly connected with the second electrode; the third lead wire is arranged on a same layer as both the source electrode and the drain electrode of the display unit, and the third electrode is connected with the third lead wire through a second lead via hole.

10. The display panel according to claim 9, wherein the deformation sensing unit comprises:
a first insulating layer covering the substrate;
a first lead wire arranged on the first insulating layer, wherein the first lead wire is arranged on a same layer as a gate electrode of the display unit;
a second insulating layer covering the first lead wire, wherein a first lead via hole exposing the first lead wire is arranged in the second insulating layer;
the first electrode and a third lead wire that are arranged on the second insulating layer, the first electrode is connected with the first lead wire through the first lead via hole, and both the first electrode and the third lead wire are arranged on a same layer as a source electrode and a drain electrode of the display unit;
a planarization layer and a dielectric layer covering both the first electrode and the third lead wire, wherein the planarization layer is provided with an electrode via hole and a second lead via hole at positions of the first electrode and the third lead wire, respectively, and the dielectric layer is provided with the electrode via hole and the second lead via hole at the positions of the first electrode and the third lead wire, respectively;
the second electrode and the third electrode arranged on the dielectric layer, wherein the second electrode and the third electrode are on two sides of the electrode via hole, respectively, and the third electrode is connected with the third lead wire through the second lead via hole; and
a pixel definition layer covering both the second electrode and the third electrode.

11. The display panel according to claim 10, wherein the display unit comprises:
an active layer arranged on the substrate;
a first insulating layer covering the active layer;
a gate electrode arranged on the first insulating layer, wherein the gate electrode and a first lead wire of the deformation sensing unit are arranged on a same layer;
a second insulating layer covering the gate electrode, wherein first connection via holes exposing the active layer are formed in the second insulating layer;
a source electrode and a drain electrode arranged on the second insulating layer, wherein the source electrode and the drain electrode are respectively connected with the active layer through the first connection via holes, and the source electrode and the drain electrode are arranged on a same layer as both the first electrode and a third lead wire of the deformation sensing unit;
a planarization layer covering the source electrode and the drain electrode, wherein a second connection via hole exposing the drain electrode is formed in the planarization layer;
an anode arranged on the planarization layer, wherein the anode is connected with the drain electrode through the second connection via hole; and
a dielectric layer and a pixel definition layer covering the anode, wherein a pixel definition opening exposing the anode is formed in the pixel definition layer.

12. The display panel according to claim 11, wherein the substrate is a flexible substrate.

13. A display device, comprising a display panel, wherein the display panel comprises:
a flexible substrate;
a deformation sensing unit on the flexible substrate;
wherein the deformation sensing unit comprises a first electrode, a second electrode, and a third electrode, the second electrode and the third electrode being configured to form a first capacitor, the first electrode and the second electrode being configured to form a second capacitor, the first electrode and the third electrode being configured to form a third capacitor, and the first capacitor, the second capacitor, and the third capacitor being configured to determine a shape-state of the display panel; and
a display unit, wherein the display unit comprises a thin film transistor, the first electrode is arranged on a same layer as both a source electrode and a drain electrode of the thin film transistor, and both the second electrode and the third electrode are arranged on a dielectric layer covering the first electrode.

14. A deformation sensing method of a display panel, wherein the display panel comprises a substrate, a deformation sensing unit is arranged on the substrate, the deformation sensing unit comprising a first electrode, a second electrode and a third electrode, the second electrode and the third electrode being configured to form a first capacitor, the first electrode and the second electrode being configured to form a second capacitor, the first electrode and the third electrode being configured to form a third capacitor; and the deformation sensing method comprises:
obtaining a change relationship of capacitance values in the deformation sensing unit; and
determining a shape-state of the display panel according to the change relationship of the capacitance values,
wherein the display panel further comprises a display unit, the display unit comprises a thin film transistor, the first electrode is arranged on a same layer as both a source electrode and a drain electrode of the thin film transistor, and both the second electrode and the third electrode are arranged on a dielectric layer covering the first electrode.

15. The deformation sensing method according to claim 14, wherein the obtaining the change relationship of the capacitance values in the deformation sensing unit comprises:
inputting scanning signals to the first electrode, the second electrode, and the third electrode respectively, detecting the capacitance value of the first capacitor and the capacitance value of the second capacitor, respectively;
comparing the capacitance value of each capacitor with a reference capacitance value of the respective capacitor, when a difference between each capacitance value and a corresponding reference capacitance value is greater than or equal to a preset change threshold, determining a change nature of the capacitance value of each capacitor; and
obtaining the change relationship of the capacitance value according to the change nature of the capacitance value of each capacitor.

16. The deformation sensing method according to claim 15, wherein the reference capacitance value is a capacitance value of each capacitor detected when the display panel is not subjected to any external force; the preset change threshold comprises a change threshold $\Delta 1$ of the first capacitor and a change threshold $\Delta 2$ of the second capacitor, $\Delta 1 = (0.02 \sim 0.1) Q_{C_1}$, $\Delta 2 = (0.02 \sim 0.1) Q_{C_2}$, where $Q_{C_1}$ is the reference capacitance value of the first capacitor, and $Q_{C_2}$ is the reference capacitance value of the second capacitor.

17. The deformation sensing method according to claim 16, wherein the comparing the capacitance value of each capacitor with the reference capacitance value of the respective capacitor, when the difference between the capacitance value and the corresponding reference capacitance value is greater than or equal to the preset change threshold, determining the change nature of the capacitance value of each capacitor, comprises:

comparing $|Q_{C1}'-Q_{C1}|$ with $\Delta 1$ and comparing $|Q_{C2}'-Q_{C2}|$ with $\Delta 2$, respectively, where $Q_{C1}'$ is a detection capacitance value of the first capacitor, and Qct' is a detection capacitance value of the second capacitor;

if $|Q_{C1}'-Q_{C1}|\geq\Delta 1$ or $|Q_{C2}'-Q_{C2}|\geq\Delta 2$, comparing $Q_{C1}'$ and $Q_{C1}$, or comparing $Q_{C2}'$ and $Q_{C2}$; and based on a comparison result to determine the change nature of each capacitor, wherein the change nature comprises: increase in capacitance value or decrease in capacitance value.

\* \* \* \* \*